US012785641B2

(12) United States Patent
McPherson et al.

(10) Patent No.: US 12,785,641 B2
(45) Date of Patent: Nov. 3, 2026

(54) AUDIO CALIBRATION OF A PORTABLE PLAYBACK DEVICE

(71) Applicant: Sonos, Inc., Goleta, CA (US)

(72) Inventors: Patrick McPherson, Somerville, MA (US); Aurelio Rafael Ramos, Jamaica Plain, MA (US)

(73) Assignee: Sonos, Inc., Goleta, CA (US)

( * ) Notice: Subject to any disclaimer, the term of this patent is extended or adjusted under 35 U.S.C. 154(b) by 90 days.

(21) Appl. No.: 18/923,278

(22) Filed: Oct. 22, 2024

(65) Prior Publication Data

US 2025/0192744 A1 Jun. 12, 2025

Related U.S. Application Data

(63) Continuation of application No. 18/447,075, filed on Aug. 9, 2023, now Pat. No. 12,132,459, which is a (Continued)

(51) Int. Cl.

*H03G 5/16* (2006.01)
*G06F 3/16* (2006.01)
*H04R 29/00* (2006.01)

(52) U.S. Cl.

CPC ............ *H03G 5/165* (2013.01); *G06F 3/165* (2013.01); *H04R 29/001* (2013.01)

(58) Field of Classification Search

CPC .......... H03G 5/165; H03G 3/32; G06F 3/165; H04R 29/001; H04R 2227/005;

(Continued)

(56) References Cited

U.S. PATENT DOCUMENTS

| | | | |
|---|---|---|---|
| 4,885,782 | A | 12/1989 | Eberbach |
| 5,438,623 | A | 8/1995 | Begault |

(Continued)

FOREIGN PATENT DOCUMENTS

| | | | |
|---|---|---|---|
| CN | 107465974 | A | 12/2017 |
| EP | 3142107 | A1 | 3/2017 |

(Continued)

OTHER PUBLICATIONS

Notice of Allowance mailed on Feb. 9, 2026, issued in connection with U.S. Appl. No. 18/189,863, filed Mar. 24, 2023, 12 pages.

(Continued)

*Primary Examiner* — Mark Fischer

(74) *Attorney, Agent, or Firm* — FORTEM IP LLP

(57) ABSTRACT

Disclosed herein are example techniques to facilitate calibrating a portable playback device. An example implementation involves determining that a playback device is to perform an equalization calibration of the playback device and initiating the equalization calibration. Initiating the equalization calibration involves (i) outputting audio content, (ii) capturing audio data representing reflections of the audio content within an area in which the playback device is located, (iii) determining an acoustic response of the area in which the playback device is located, (iv) selecting a stored acoustic response from the acoustic response database that is most similar to the determined acoustic response of the area in which the playback device is located, and (v) applying to the audio content, via the playback device, a set of stored audio calibration settings associated with the selected stored acoustic area response.

20 Claims, 13 Drawing Sheets

Related U.S. Application Data continuation of application No. 17/807,595, filed on Jun. 17, 2022, now Pat. No. 11,728,780, which is a continuation of application No. 16/919,467, filed on Jul. 2, 2020, now Pat. No. 11,374,547, which is a continuation of application No. 16/538,629, filed on Aug. 12, 2019, now Pat. No. 10,734,965.

(58) Field of Classification Search
CPC ........... H04R 27/00; H04R 3/04; H04S 7/301; H04S 7/305
See application file for complete search history.

(56) References Cited

U.S. PATENT DOCUMENTS 5,586,172 A 12/1996 Sakurai et al.
5,717,768 A 2/1998 Laroche
5,857,172 A 1/1999 Rozak
D559,197 S 1/2008 Lim et al.
D575,801 S 8/2008 Kusano et al.
D582,429 S 12/2008 Kusano et al.
7,496,205 B2 2/2009 Kuehnel
8,239,206 B1 8/2012 Lebeau et al.
8,285,405 B2 10/2012 Goh et al.
8,325,909 B2 12/2012 Tashev et al.
8,340,975 B1 12/2012 Rosenberger
8,423,893 B2 4/2013 Ramsay et al.
8,762,156 B2 6/2014 Chen
9,002,024 B2 4/2015 Nakadai et al.
9,047,857 B1 6/2015 Barton
9,088,336 B2 7/2015 Mani et al.
9,094,768 B2 7/2015 LaBosco
9,148,742 B1 9/2015 Koulomzin et al.
9,401,058 B2 7/2016 De La Fuente et al.
9,431,021 B1 8/2016 Scalise et al.
9,431,029 B2 8/2016 Yook et al.
9,438,996 B2 9/2016 Maher et al.
9,456,279 B1 9/2016 Murdoch
9,516,444 B2 12/2016 Riggi et al.
9,632,748 B2 4/2017 Faaborg
9,672,812 B1 6/2017 Watanabe et al.
9,691,384 B1 6/2017 Wang et al.
9,769,580 B2 9/2017 Rabinowitz et al.
9,842,584 B1 12/2017 Hart et al.
9,866,964 B1 1/2018 Haskin et al.
9,898,250 B1 2/2018 Williams et al.
9,900,723 B1 2/2018 Choisel et al.
9,916,839 B1 3/2018 Scalise et al.
9,997,151 B1 6/2018 Ayrapetian et al.
10,002,259 B1 6/2018 Mai
10,028,069 B1 7/2018 Lang
10,074,371 B1 9/2018 Wang et al.
10,097,919 B2 10/2018 Jarvis et al.
10,152,969 B2 12/2018 Reilly et al.
10,200,800 B2 2/2019 Thomson
10,248,376 B2 4/2019 Keyser-Allen et al.
10,249,205 B2 4/2019 Hammersley et al.
10,304,440 B1 5/2019 Panchapagesan et al.
10,555,077 B2 2/2020 Jarvis et al.
10,567,900 B2 2/2020 Tanaka et al.
10,586,534 B1 3/2020 Argyropoulos et al.
10,720,173 B2 7/2020 Freeman et al.
10,811,015 B2 10/2020 Smith et al.
10,817,249 B2 10/2020 Tanaka et al.
10,847,137 B1 11/2020 Mandal et al.
10,853,027 B2 12/2020 Shih et al.
10,986,460 B2 4/2021 Reilly et al.
11,062,705 B2 7/2021 Watanabe et al.
11,184,704 B2 11/2021 Jarvis et al.
11,184,726 B2 11/2021 Hartung et al.
11,197,117 B2 12/2021 Reilly et al.
11,295,754 B2 4/2022 Eubank et al.
11,356,520 B2 6/2022 Starobin et al.
11,540,073 B2 12/2022 Oishi et al.
11,696,074 B2 7/2023 Woo et al.
11,696,081 B2 7/2023 Bush
11,700,139 B2 7/2023 Drake
11,727,936 B2 8/2023 Smith et al.
11,736,877 B2 8/2023 Jarvis et al.
11,803,350 B2 10/2023 Sheen
11,816,393 B2 11/2023 Vega-Zayas et al.
11,825,290 B2 11/2023 Reilly et al.
11,832,068 B2 11/2023 Jarvis et al.
11,849,299 B2 12/2023 Reilly et al.
11,889,276 B2 1/2024 McPherson et al.
11,995,376 B2 5/2024 Hartung et al.
2002/0054685 A1 5/2002 Avendano et al.
2002/0055950 A1 5/2002 Witteman
2004/0153321 A1 8/2004 Chung et al.
2005/0129254 A1 6/2005 Connor et al.
2005/0131558 A1 6/2005 Braithwaite et al.
2006/0013197 A1 1/2006 Anderson
2006/0093998 A1 5/2006 Vertegaal
2006/0238877 A1 10/2006 Ashkenazi et al.
2007/0135061 A1 6/2007 Buck et al.
2008/0031475 A1 2/2008 Goldstein
2008/0045140 A1 2/2008 Korhonen
2008/0146289 A1 6/2008 Korneluk et al.
2008/0147461 A1 6/2008 Lee et al.
2008/0160977 A1 7/2008 Ahmaniemi et al.
2008/0192946 A1 8/2008 Faller
2008/0268823 A1 10/2008 Shalev et al.
2008/0316863 A1 12/2008 Walley
2009/0013255 A1 1/2009 Yuschik et al.
2009/0175216 A1 7/2009 Bozarth et al.
2009/0175510 A1 7/2009 Grim, III et al.
2009/0204410 A1 8/2009 Mozer et al.
2009/0214048 A1 8/2009 Stokes, III et al.
2009/0232481 A1 9/2009 Baalbergen et al.
2009/0235236 A1 9/2009 Nickerson et al.
2009/0316923 A1* 12/2009 Tashev .................. H04R 3/005 381/71.1
2009/0326949 A1 12/2009 Douthitt et al.
2010/0114944 A1 5/2010 Adler et al.
2010/0131642 A1 5/2010 Chalikouras et al.
2010/0136952 A1 6/2010 Rofougaran
2010/0260348 A1 10/2010 Bhow et al.
2010/0299639 A1 11/2010 Ramsay et al.
2010/0317332 A1 12/2010 Bathiche et al.
2010/0329472 A1 12/2010 Nakadai et al.
2011/0019833 A1 1/2011 Kuech et al.
2011/0044461 A1 2/2011 Kuech et al.
2011/0064232 A1 3/2011 Ruwisch
2011/0157168 A1 6/2011 Bennett et al.
2011/0164188 A1 7/2011 Karaoguz et al.
2011/0176687 A1 7/2011 Birkenes
2011/0216093 A1 9/2011 Griffin
2012/0027218 A1 2/2012 Every et al.
2012/0076308 A1 3/2012 Kuech et al.
2012/0224457 A1 9/2012 Kim et al.
2012/0237047 A1 9/2012 Neal et al.
2012/0254220 A1 10/2012 Verthein et al.
2012/0269356 A1* 10/2012 Sheerin ................ H04R 29/004 381/370
2013/0080167 A1 3/2013 Mozer
2013/0080171 A1 3/2013 Mozer et al.
2013/0083948 A1 4/2013 Schmidt
2013/0111347 A1 5/2013 Reilly et al.
2013/0129100 A1 5/2013 Sorensen
2013/0170363 A1 7/2013 Millington et al.
2013/0177188 A1 7/2013 Apfel et al.
2013/0283169 A1 10/2013 Van Wie
2013/0289994 A1 10/2013 Newman et al.
2013/0308794 A1 11/2013 Jochim et al.
2013/0336499 A1 12/2013 Beckhardt et al.
2013/0339028 A1 12/2013 Rosner et al.
2014/0075308 A1 3/2014 Sanders et al.
2014/0094151 A1 4/2014 Klappert et al.
2014/0112502 A1 4/2014 Lee
2014/0122075 A1 5/2014 Bak et al.
2014/0154993 A1 6/2014 Bates et al.
2014/0180697 A1 6/2014 Torok et al.
2014/0188476 A1 7/2014 Li et al.
2014/0244712 A1 8/2014 Walters et al.

(56) References Cited

U.S. PATENT DOCUMENTS

2014/0270216 A1 9/2014 Tsilfidis et al.
2014/0270248 A1 9/2014 Ivanov et al.
2014/0274203 A1 9/2014 Ganong, III et al.
2014/0278343 A1 9/2014 Tran
2014/0363022 A1 12/2014 Dizon et al.
2015/0006176 A1 1/2015 Pogue et al.
2015/0018992 A1 1/2015 Griffiths et al.
2015/0023521 A1 1/2015 Jones et al.
2015/0039303 A1 2/2015 Lesso et al.
2015/0039310 A1 2/2015 Clark et al.
2015/0039311 A1 2/2015 Clark et al.
2015/0051723 A1 2/2015 Bates et al.
2015/0073807 A1 3/2015 Kumar
2015/0086034 A1 3/2015 Lombardi et al.
2015/0106085 A1 4/2015 Lindahl
2015/0112672 A1 4/2015 Giacobello et al.
2015/0124975 A1 5/2015 Pontoppidan
2015/0126255 A1 5/2015 Yang et al.
2015/0154953 A1 6/2015 Bapat et al.
2015/0200923 A1 7/2015 Triplett
2015/0215382 A1 7/2015 Arora et al.
2015/0222563 A1 8/2015 Burns et al.
2016/0011846 A1* 1/2016 Sheen .................... G06F 3/165 700/94
2016/0027440 A1 1/2016 Gelfenbeyn et al.
2016/0034448 A1 2/2016 Tran
2016/0066087 A1 3/2016 Solbach et al.
2016/0093281 A1 3/2016 Kuo et al.
2016/0098393 A1 4/2016 Hebert
2016/0098992 A1 4/2016 Renard et al.
2016/0118048 A1 4/2016 Heide
2016/0148612 A1 5/2016 Guo et al.
2016/0154089 A1 6/2016 Altman
2016/0155443 A1 6/2016 Khan et al.
2016/0316502 A1 10/2016 DeCicco
2016/0330547 A1 11/2016 Du et al.
2017/0070817 A1 3/2017 Seo et al.
2017/0070826 A1 3/2017 Pedersen et al.
2017/0075645 A1 3/2017 Sheen et al.
2017/0084278 A1 3/2017 Jung
2017/0084292 A1 3/2017 Yoo
2017/0090864 A1 3/2017 Jorgovanovic
2017/0103754 A1 4/2017 Higbie et al.
2017/0110130 A1 4/2017 Sharifi et al.
2017/0110144 A1 4/2017 Sharifi et al.
2017/0236512 A1 8/2017 Williams et al.
2017/0242653 A1 8/2017 Lang et al.
2017/0242657 A1 8/2017 Jarvis et al.
2017/0243587 A1 8/2017 Plagge et al.
2017/0269975 A1 9/2017 Wood et al.
2017/0287496 A1 10/2017 Heitkamp et al.
2017/0332168 A1 11/2017 Moghimi et al.
2017/0353789 A1 12/2017 Kim et al.
2017/0358313 A1 12/2017 Shih
2017/0365247 A1 12/2017 Ushakov
2018/0033428 A1 2/2018 Kim et al.
2018/0033429 A1 2/2018 Makke et al.
2018/0039530 A1 2/2018 Ciabarra, Jr. et al.
2018/0040324 A1 2/2018 Wilberding
2018/0061409 A1 3/2018 Valentine et al.
2018/0084367 A1 3/2018 Greff et al.
2018/0091898 A1 3/2018 Yoon et al.
2018/0096678 A1 4/2018 Zhou et al.
2018/0108351 A1 4/2018 Beckhardt et al.
2018/0132298 A1 5/2018 Birnam et al.
2018/0137857 A1 5/2018 Zhou et al.
2018/0165055 A1 6/2018 Yu et al.
2018/0167981 A1 6/2018 Jonna et al.
2018/0182390 A1 6/2018 Hughes et al.
2018/0182410 A1 6/2018 Kaskari et al.
2018/0192215 A1 7/2018 Sheen
2018/0197533 A1 7/2018 Lyon et al.
2018/0233137 A1 8/2018 Torok et al.
2018/0277107 A1 9/2018 Kim
2018/0277113 A1 9/2018 Hartung et al.
2018/0336892 A1 11/2018 Kim et al.
2018/0350356 A1 12/2018 Garcia
2018/0350379 A1 12/2018 Wung et al.
2018/0352334 A1 12/2018 Family et al.
2018/0358019 A1 12/2018 Mont-Reynaud
2018/0367944 A1 12/2018 Heo et al.
2019/0013019 A1 1/2019 Lawrence
2019/0035404 A1 1/2019 Gabel et al.
2019/0066710 A1 2/2019 Bryan et al.
2019/0073999 A1 3/2019 Prémont et al.
2019/0081507 A1 3/2019 Ide
2019/0104373 A1 4/2019 Wodrich et al.
2019/0122662 A1 4/2019 Chang et al.
2019/0156847 A1 5/2019 Bryan et al.
2019/0172476 A1 6/2019 Wung et al.
2019/0237069 A1 8/2019 Zhao et al.
2019/0237089 A1 8/2019 Shin
2019/0251960 A1 8/2019 Maker et al.
2019/0259408 A1 8/2019 Freeman et al.
2019/0287536 A1 9/2019 Sharifi et al.
2019/0295563 A1 9/2019 Kamdar et al.
2019/0311715 A1 10/2019 Pfeffinger et al.
2019/0311718 A1 10/2019 Huber et al.
2019/0311722 A1 10/2019 Caldwell
2019/0318729 A1 10/2019 Chao et al.
2019/0325870 A1 10/2019 Mitic
2019/0325888 A1 10/2019 Geng
2019/0341037 A1 11/2019 Bromand et al.
2019/0341038 A1 11/2019 Bromand et al.
2019/0371324 A1 12/2019 Powell et al.
2019/0392832 A1 12/2019 Mitsui et al.
2020/0090644 A1 3/2020 Klingler et al.
2020/0090646 A1 3/2020 Smith et al.
2020/0098354 A1 3/2020 Lin et al.
2020/0135194 A1 4/2020 Jeong
2021/0287670 A1 9/2021 Regan et al.
2021/0295833 A1 9/2021 Rastrow et al.
2022/0030373 A1 1/2022 Mehta et al.
2022/0036882 A1 2/2022 Ahn et al.
2022/0083136 A1 3/2022 DeLeeuw
2023/0283949 A1 9/2023 Radisavljevic et al.

FOREIGN PATENT DOCUMENTS

JP 2001286000 A 10/2001
JP 2003223188 A 8/2003
JP 2004163590 A 6/2004
JP 2006086380 A 3/2006
JP 2008217444 A 9/2008
JP 2015022268 A 2/2015
JP 2016009193 A 1/2016
JP 2016024652 A 2/2016
JP 2016095383 A 5/2016
JP 2016524193 A 8/2016
JP 2016212312 A 12/2016
JP 2018500529 A 1/2018
JP 2020048867 A 4/2020
JP 2022001030 A 1/2022
JP 2022046752 A 3/2022
KR 20060060772 A 6/2006
KR 100966415 B1 6/2010
KR 20120111130 A 10/2012
KR 20130050987 A 5/2013
KR 20140111859 A 9/2014
KR 20160005045 A 1/2016
KR 20160007527 A 1/2016
KR 20160101198 A 8/2016
KR 20160145634 A 12/2016
WO 2016003509 A1 1/2016
WO 2016014686 A1 1/2016
WO 2016085775 A2 6/2016
WO 2016171956 A1 10/2016
WO 2017058654 A1 4/2017
WO 2017147081 A1 8/2017
WO 2020006410 A1 1/2020

(56) References Cited

FOREIGN PATENT DOCUMENTS

| | | |
|---|---|---|
| WO | 2020252163 A1 | 12/2020 |
| WO | 2021030334 A1 | 2/2021 |

OTHER PUBLICATIONS

Notice of Allowance mailed on Feb. 9, 2026, issued in connection with U.S. Appl. No. 18/308,087, filed Apr. 27, 2023, 09 pages.
Notice of Allowance mailed on Jul. 1, 2024, issued in connection with U.S. Appl. No. 18/511,775, filed Nov. 16, 2023, 11 pages.
Notice of Allowance mailed on Jul. 10, 2024, issued in connection with U.S. Appl. No. 18/309,939, filed May 1, 2023, 5 pages.
Notice of Allowance mailed on Feb. 11, 2026, issued in connection with U.S. Appl. No. 18/463,762, filed Sep. 8, 2023, 09 pages.
Notice of Allowance mailed on Oct. 11, 2024, issued in connection with U.S. Appl. No. 18/351,033, filed Jul. 12, 2023, 09 pages.
Notice of Allowance mailed on Jun. 12, 2024, issued in connection with U.S. Appl. No. 17/807,270, filed Jun. 16, 2022, 10 pages.
Notice of Allowance mailed on Sep. 12, 2024, issued in connection with U.S. Appl. No. 18/432,265, filed Feb. 5, 2024, 8 pages.
Notice of Allowance mailed on Nov. 14, 2024, issued in connection with U.S. Appl. No. 18/343,487, filed Jun. 28, 2023, 12 pages.
Notice of Allowance mailed on Aug. 15, 2025, issued in connection with U.S. Appl. No. 18/600,044, filed Mar. 8, 2024, 07 pages.
Notice of Allowance mailed on Jan. 15, 2025, issued in connection with U.S. Appl. No. 18/449,388, filed Aug. 14, 2023, 8 pages.
Notice of Allowance mailed on Jan. 15, 2026, issued in connection with U.S. Appl. No. 19/028,592, filed Jan. 17, 2025, 9 pages.
Notice of Allowance mailed on Jul. 17, 2024, issued in connection with U.S. Appl. No. 18/310,025, filed May 1, 2023, 7 pages.
Notice of Allowance mailed on Jun. 18, 2024, issued in connection with U.S. Appl. No. 18/297,214, filed Apr. 7, 2023, 10 pages.
Notice of Allowance mailed on Aug. 19, 2024, issued in connection with U.S. Appl. No. 18/345,588, filed Jun. 30, 2023, 20 pages.
Notice of Allowance mailed on Jul. 19, 2024, issued in connection with U.S. Appl. No. 18/328,932, filed Jun. 5, 2023, 9 pages.
Notice of Allowance mailed on Jun. 20, 2025, issued in connection with U.S. Appl. No. 18/424,041, filed Jan. 26, 2024, 8 pages.
Notice of Allowance mailed on Oct. 20, 2025, issued in connection with U.S. Appl. No. 18/308,065, filed Apr. 27, 2023, 08 pages.
Notice of Allowance mailed on Nov. 21, 2024, issued in connection with U.S. Appl. No. 18/323,039, filed May 24, 2023, 07 pages.
Notice of Allowance mailed on Jul. 24, 2024, issued in connection with U.S. Appl. No. 18/456,941, filed Aug. 28, 2023, 11 pages.
Notice of Allowance mailed on Jun. 24, 2024, issued in connection with U.S. Appl. No. 18/447,075, filed Aug. 9, 2023, 11 pages.
Notice of Allowance mailed on Jul. 26, 2024, issued in connection with U.S. Appl. No. 18/408,865, filed Jan. 10, 2024, 9 pages.
Notice of Allowance mailed on Jun. 27, 2025, issued in connection with U.S. Appl. No. 18/657,019, filed May 7, 2024, 5 pages.
Notice of Allowance mailed on Aug. 28, 2024, issued in connection with U.S. Appl. No. 18/432,733, filed Feb. 5, 2024, 10 pages.
Notice of Allowance mailed on Jul. 29, 2024, issued in connection with U.S. Appl. No. 18/459,982, filed Sep. 1, 2023, 08 pages.
Notice of Allowance mailed on Jul. 3, 2024, issued in connection with U.S. Appl. No. 18/507,713, filed Nov. 13, 2023, 11 pages.
Notice of Allowance mailed on Jul. 31, 2024, issued in connection with U.S. Appl. No. 18/192,452, filed Mar. 29, 2023, 8 pages.
Notice of Allowance mailed on Jul. 31, 2024, issued in connection with U.S. Appl. No. 18/453,052, filed Aug. 21, 2023, 9 pages.
Notice of Allowance mailed on Aug. 7, 2024, issued in connection with U.S. Appl. No. 18/478,241, filed Sep. 29, 2023, 10 pages.
Notice of Allowance mailed on Jun. 7, 2024, issued in connection with U.S. Appl. No. 18/316,434, filed May 12, 2023, 9 pages.
PaulStamatiou., "Review: Sonos ZonePlayer S5 All-In-One Wireless Music System," PaulStamatiou.com, 2009, pp. 1-11. acquired at https://web.archive.org/web/20101127024648/https://paulstamatiou.com/review-sonos-zoneplayer-s5-all-in-one-wireless-music-system.
Souden M., et al., "On Optimal Frequency-Domain Multichannel Linear Filtering for Noise Reduction," IEEE Transactions on Audio, Speech, and Language Processing, Feb. 2010, vol. 18(2), 17 pages.
Supplemental Notice of Allowance mailed on Oct. 8, 2025, issued in connection with U.S. Appl. No. 18/424,041, filed Jan. 26, 2024, 03 pages.
The Absolute Sound., "Sonos Multi-Room Music System," 2009, pp. 1-8. Review: https://www.theabsolutesound.com/articles/sonos-multi-room-music-system/.
International Bureau, International Preliminary Report on Patentability, mailed on Apr. 4, 2024, issued in connection with International Application No. PCT/US2022/076972, filed on Sep. 23, 2022, 14 pages.
International Bureau, International Search Report and Written Opinion mailed on Mar. 23, 2023, issued in connection with International Application No. PCT/US2022/076972, filed on Sep. 23, 2022, 20 pages.
Japanese Patent Office, Decision to Grant a Patent and Translation mailed on Dec. 10, 2024, issued in connection with Japanese Patent Application No. 2022-115789, 5 pages.
Japanese Patent Office, Decision to Grant and Translation mailed on Feb. 3, 2026, issued in connection with Japanese Patent Application No. 2023-164165, 5 pages.
Japanese Patent Office, English Translation of Office Action mailed on Apr. 2, 2024, issued in connection with Japanese Application No. 2022-115789, 6 pages.
Japanese Patent Office, Notice of Reasons for Refusal and Translation mailed on Jul. 1, 2025, issued in connection with Japanese Patent Application No. 2023-164165, 10 pages.
Japanese Patent Office, Notice of Reasons for Refusal and Translation mailed on Dec. 10, 2024, issued in connection with Japanese Patent Application No. 2023-149069, 8 pages.
Japanese Patent Office, Notice of Reasons for Refusal and Translation mailed on Dec. 17, 2024, issued in connection with Japanese Patent Application No. 2023-164165, 9 pages.
Japanese Patent Office, Notice of Reasons for Refusal and Translation mailed on Dec. 3, 2024, issued in connection with Japanese Patent Application No. 2023-144379, 12 pages.
Japanese Patent Office, Notice of Reasons for Refusal and Translation mailed on Dec. 3, 2024, issued in connection with Japanese Patent Application No. 2023-144387, 8 pages.
Japanese Patent Office, Office Action and Translation mailed on Jul. 11, 2024, issued in connection with Japanese Application No. 2022-115789, 10 pages.
Japanese Patent Office, Office Action and Translation mailed on Oct. 8, 2024, issued in connection with Japanese Patent Application No. 2023-118922, 9 pages.
Korean Patent Office, Korean Examination Report and Translation mailed on Jul. 17, 2024, issued in connection with Korean Application No. 10-2022-7024007, 10 pages.
Korean Patent Office, Korean Examination Report and Translation mailed on Aug. 5, 2024, issued in connection with Korean Application No. 10-2023-7031855, 10 pages.
Korean Patent Office, Korean Examination Report and Translation mailed on Nov. 6, 2024, issued in connection with Korean Application No. 10-2023-7032988, 13 pages.
Korean Patent Office, Korean Office Action and Translation mailed on Oct. 20, 2024, issued in connection with Korean Application No. 10-2023-7036702, 22 pages.
Non-Final Office Action mailed on Mar. 3, 2025, issued in connection with U.S. Appl. No. 18/308,087, filed Apr. 27, 2023, 25 pages.
Non-Final Office Action mailed on Mar. 3, 2026, issued in connection with U.S. Appl. No. 18/597,873, filed Mar. 6, 2024, 17 pages.
Non-Final Office Action mailed on Sep. 10, 2025, issued in connection with U.S. Appl. No. 18/356,477, filed Jul. 21, 2023, 20 pages.
Non-Final Office Action mailed on Jul. 11, 2024, issued in connection with U.S. Appl. No. 18/313,013, filed May 5, 2023, 18 pages.
Non-Final Office Action mailed on Feb. 12, 2025, issued in connection with U.S. Appl. No. 18/189,863, filed Mar. 24, 2023, 28 pages.

(56) References Cited

OTHER PUBLICATIONS

Non-Final Office Action mailed on Nov. 14, 2025, issued in connection with U.S. Appl. No. 18/674,039, filed May 24, 2024, 17 pages.
Non-Final Office Action mailed on Aug. 15, 2024, issued in connection with U.S. Appl. No. 18/323,039, filed May 24, 2023, 09 pages.
Non-Final Office Action mailed on Aug. 15, 2024, issued in connection with U.S. Appl. No. 18/487,290, filed Oct. 16, 2023, 13 pages.
Non-Final Office Action mailed on Oct. 16, 2025, issued in connection with U.S. Appl. No. 18/440,111, filed Feb. 13, 2024, 28 pages.
Non-Final Office Action mailed on Oct. 17, 2025, issued in connection with U.S. Appl. No. 18/502,349, filed Nov. 6, 2023, 09 pages.
Non-Final Office Action mailed on Sep. 17, 2024, issued in connection with U.S. Appl. No. 18/449,388, filed Aug. 14, 2023, 22 pages.
Non-Final Office Action mailed on Feb. 18, 2025, issued in connection with U.S. Appl. No. 18/600,044, filed Mar. 8, 2024, 28 pages.
Non-Final Office Action mailed on Jun. 20, 2024, issued in connection with U.S. Appl. No. 18/007,415, filed Jan. 30, 2023, 12 pages.
Non-Final Office Action mailed on Jun. 20, 2024, issued in connection with U.S. Appl. No. 18/520,336, filed Nov. 27, 2023, 20 pages.
Non-Final Office Action mailed on Mar. 20, 2025, issued in connection with U.S. Appl. No. 19/028,592, filed Jan. 17, 2025, 33 pages.
Non-Final Office Action mailed on May 20, 2024, issued in connection with U.S. Appl. No. 18/600,044, filed Mar. 8, 2024, 24 pages.
Non-Final Office Action mailed on Mar. 21, 2025, issued in connection with U.S. Appl. No. 19/029,744, filed Jan. 17, 2025, 26 pages.
Non-Final Office Action mailed on Nov. 22, 2024, issued in connection with U.S. Appl. No. 18/308,065, filed Apr. 27, 2023, 15 pages.
Non-Final Office Action mailed on Feb. 26, 2025, issued in connection with U.S. Appl. No. 18/657,019, filed May 7, 2024, 27 pages.
Non-Final Office Action mailed on Nov. 26, 2024, issued in connection with U.S. Appl. No. 18/424,041, filed Jan. 26, 2024, 07 pages.
Non-Final Office Action mailed on Feb. 27, 2025, issued in connection with U.S. Appl. No. 18/487,290, filed Oct. 16, 2023, 14 pages.
Non-Final Office Action mailed on Aug. 28, 2025, issued in connection with U.S. Appl. No. 18/463,762, filed Sep. 8, 2023, 14 pages.
Non-Final Office Action mailed on Sep. 29, 2024, issued in connection with U.S. Appl. No. 18/356,477, filed Jul. 21, 2023, 26 pages.
Non-Final Office Action mailed on Sep. 29, 2024, issued in connection with U.S. Appl. No. 18/440,111, filed Feb. 13, 2024, 25 pages.
Non-Final Office Action mailed on Jul. 30, 2024, issued in connection with U.S. Appl. No. 17/994,577, filed Nov. 28, 2022, 13 pages.
Non-Final Office Action mailed on Aug. 6, 2024, issued in connection with U.S. Appl. No. 18/313,859, filed May 8, 2023, 20 pages.
Non-Final Office Action mailed on Aug. 7, 2024, issued in connection with U.S. Appl. No. 18/502,644, filed Nov. 6, 2023, 31 pages.
Non-Final Office Action mailed on Aug. 8, 2024, issued in connection with U.S. Appl. No. 18/463,827, filed Sep. 8, 2023, 7 pages.
Non-Final Office Action mailed on Jul. 8, 2024, issued in connection with U.S. Appl. No. 18/520,531, filed Nov. 27, 2023, 63 pages.
Notice of Allowance mailed on Aug. 1, 2025, issued in connection with U.S. Appl. No. 18/487,290, filed Oct. 16, 2023, 07 pages.
Notice of Allowance mailed on Dec. 3, 2025, issued in connection with U.S. Appl. No. 19/029,744, filed Jan. 17, 2025, 09 pages.
Notice of Allowance mailed on Dec. 5, 2024, issued in connection with U.S. Appl. No. 18/463,827, filed Sep. 8, 2023, 9 pages.
Notice of Allowance mailed on Aug. 7, 2024, issued in connection with U.S. Appl. No. 18/338,841, filed Jun. 21, 2023, 05 pages.
Notice of Allowance mailed on Jan. 7, 2026, issued in connection with U.S. Appl. No. 18/667,330, filed May 17, 2024, 12 pages.
802.15 Wikipedia page available 2011 (Year: 2011).
Advisory Action mailed on Apr. 24, 2024, issued in connection with U.S. Appl. No. 17/807,270, filed Jun. 16, 2022, 3 pages.
Australian Patent Office, Australian Examination Report Action mailed on Aug. 16, 2024, issued in connection with Australian Application No. 2023248160, 2 pages.
Australian Patent Office, Australian Examination Report Action mailed on Sep. 18, 2024, issued in connection with Australian Application No. 2020218258, 3 pages.
Australian Patent Office, Australian Examination Report Action mailed on Aug. 19, 2024, issued in connection with Australian Application No. 2023237094, 2 pages.
Australian Patent Office, Australian Examination Report Action mailed on Jan. 23, 2025, issued in connection with Australian Application No. 2020329905, 3 pages.
Australian Patent Office, Australian Examination Report Action mailed on Jul. 29, 2024, issued in connection with Australian Application No. 2023237192, 3 pages.
Bahl P., et al., "RADAR: An In-Building RF-based User Location and Tracking System," IEEE c2000, 2000, pp. 775-784.
Bluetooth Wikipedia page available 2011 (Year: 2011).
Bohn, Dieter. The Verge. "Amazon Creates a Huge Alliance to Demand Voice Assistant Compatibility." Sep. 24, 2019, 15 pages. Retrieved from the Internet: URL: https://www.theverge.com/2019/9/24/20881321/amazon-voice-interoperability-initiative-alexa-microsoft-baidu-intel-qualcommspotify-assistants.
Canadian Patent Office, Canadian Examination Report mailed on Oct. 1, 2024, issued in connection with Canadian Application No. 3123601, 4 pages.
Canadian Patent Office, Canadian Examination Report mailed on Aug. 12, 2024, issued in connection with Canadian Application No. 3067776, 3 pages.
Canadian Patent Office, Canadian Examination Report mailed on May 17, 2024, issued in connection with Canadian Application No. 3148021, 5 pages.
Canadian Patent Office, Canadian Examination Report mailed on Jun. 18, 2024, issued in connection with Canadian Application No. 3084279, 4 pages.
Corrected Notice of Allowance mailed on Mar. 10, 2026, issued in connection with U.S. Appl. No. 19/028,592, filed Jan. 17, 2025, 02 pages.
Corrected Notice of Allowance mailed on Aug. 15, 2025, issued in connection with U.S. Appl. No. 18/487,290, filed Oct. 16, 2023, 04 pages.
European Patent Office, European EPC Article 94.3 mailed on Dec. 19, 2024, issued in connection with European Application No. 22153523, 4 pages.
European Patent Office, European EPC Article 94.3 mailed on Jul. 22, 2024, issued in connection with European Application No. 23188226.7, 9 pages.
European Patent Office, European EPC Article 94.3 mailed on Jan. 30, 2024, issued in connection with European Application No. 22155834.9, 4 pages.
European Patent Office, European EPC Article 94.3 mailed on Jun. 4, 2024, issued in connection with European Application No. 21180778.9, 5 pages.
European Patent Office, European Extended Search Report mailed on Dec. 6, 2024, issued in connection with European Application No. 24174559.5, 12 pages.
European Patent Office, European Extended Search Report mailed on Apr. 15, 2024, issued in connection with European Application No. 23212793.6, 9 pages.
European Patent Office, European Extended Search Report mailed on Aug. 2, 2025, issued in connection with European Application No. 24219860.4, 11 pages.

(56) References Cited

OTHER PUBLICATIONS

European Patent Office, European Extended Search Report mailed on Feb. 24, 2025, issued in connection with European Application No. 24192454.7, 11 pages.
European Patent Office, European Extended Search Report mailed on Jul. 9, 2024, issued in connection with European Application No. 24162741.3, 12 pages.
European Patent Office, Summons to Attend Oral Proceedings mailed on Sep. 1, 2025, issued in connection with European Application No. 21171959.6, 9 pages.
European Patent Office, Summons to Attend Oral Proceedings mailed on Jun. 26, 2024, issued in connection with European Application No. 19740292.8, 10 pages.
European Patent Office, Summons to Attend Oral Proceedings mailed on Nov. 29, 2024, issued in connection with European Application No. 21193616.6, 9 pages.
European Patent Office, Summons to Attend Oral Proceedings mailed on Aug. 5, 2025, issued in connection with European Application No. 20761443.9, 12 pages.
European Patent Office, Summons to Attend Oral Proceedings mailed on Aug. 6, 2024, issued in connection with European Application No. 18789515.6, 8 pages.
Final Office Action mailed on Aug. 1, 2025, issued in connection with U.S. Appl. No. 19/029,744 , filed on Jan. 17, 2025, 27 pages.
Final Office Action mailed on Oct. 2, 2025, issued in connection with U.S. Appl. No. 18/189,863, filed Mar. 24, 2023, 33 pages.
Final Office Action mailed on Sep. 5, 2024, issued in connection with U.S. Appl. No. 18/343,487, filed Jun. 28, 2023, 12 pages.
Final Office Action mailed on Aug. 6, 2025, issued in connection with U.S. Appl. No. 19/028,592, filed Jan. 17, 2025, 35 pages.
Final Office Action mailed on Oct. 7, 2025, issued in connection with U.S. Appl. No. 18/308,087, filed Apr. 27, 2023, 25 pages.
Final Office Action mailed on Jun. 10, 2025, issued in connection with U.S. Appl. No. 18/308,065, filed Apr. 27, 2023, 18 pages.
Final Office Action mailed on Feb. 13, 2026, issued in connection with U.S. Appl. No. 18/502,349, filed Nov. 6, 2023, 13 pages.
Final Office Action mailed on Nov. 13, 2024, issued in connection with U.S. Appl. No. 18/487,290, filed Oct. 16, 2023, 13 pages.
Final Office Action mailed on Mar. 14, 2025, issued in connection with U.S. Appl. No. 18/440,111, filed Feb. 13, 2024, 30 pages.
Final Office Action mailed on Mar. 17, 2025, issued in connection with U.S. Appl. No. 18/356,477, filed Jul. 21, 2023, 25 pages.
Final Office Action mailed on Jul. 18, 2024, issued in connection with U.S. Appl. No. 17/450,925, filed Oct. 14, 2021, 11 pages.
Final Office Action mailed on Aug. 2, 2024, issued in connection with U.S. Appl. No. 18/048,034, filed Oct. 20, 2022, 7 pages.
Final Office Action mailed on Jul. 2, 2024, issued in connection with U.S. Appl. No. 18/308,065, filed Apr. 27, 2023, 17 pages.
Final Office Action mailed on May 20, 2024, issued in connection with U.S. Appl. No. 18/308,087, filed Apr. 27, 2023, 29 pages.
Final Office Action mailed on Oct. 22, 2024, issued in connection with U.S. Appl. No. 17/458,673, filed Aug. 27, 2021, 27 pages.
Final Office Action mailed on Jan. 3, 2024, issued in connection with U.S. Appl. No. 17/807,270, filed Jun. 16, 2022, 22 pages.
Final Office Action mailed on Jul. 8, 2024, issued in connection with U.S. Appl. No. 17/222,950, filed Apr. 5, 2021, 10 pages.
Final Office Action mailed on May 8, 2024, issued in connection with U.S. Appl. No. 18/189,863, filed Mar. 24, 2023, 28 pages.
International Bureau, International Preliminary Report on Patentability, mailed on Apr. 11, 2024, issued in connection with International Application No. PCT/US2022/077107, filed on Sep. 27, 2022, 9 pages.
International Bureau, International Preliminary Report on Patentability, mailed on Aug. 22, 2024, issued in connection with International Application No. PCT/US2023/062179, filed on Feb. 8, 2023, 8 pages.

* cited by examiner

250a

| RECORD # | DEVICE TYPE | LOCALIZED RESPONSE | MULTI-LOCATION RESPONSE | CALIBRATION SETTINGS |
|---|---|---|---|---|
| 1 | TYPE A | RESPONSE 1 | RESPONSE 1 | SETTINGS 1 |
| 2 | TYPE A | RESPONSE 2 | RESPONSE 2 | SETTINGS 2 |
| 3 | TYPE B | RESPONSE 3 | RESPONSE 3 | SETTINGS 3 |
| 4 | TYPE B | RESPONSE 4 | RESPONSE 4 | SETTINGS 4 |
| 5 | TYPE C | RESPONSE 5 | RESPONSE 5 | SETTINGS 5 |

*Fig. 2B*

AUDIO CALIBRATION OF A PORTABLE PLAYBACK DEVICE

CROSS-REFERENCE TO RELATED APPLICATIONS

This application is a continuation of U.S. patent application Ser. No. 18/447,075, filed Aug. 9, 2023, now U.S. Pat. No. 12,132,459, issued Oct. 29, 2024, which is a continuation of U.S. patent application Ser. No. 17/807,595, filed Jun. 17, 2022, now U.S. Pat. No. 11,728,780, issued Aug. 15, 2023, which is a continuation of U.S. patent application Ser. No. 16/919,467, filed Jul. 2, 2020, now U.S. Pat. No. 11,374,547, issued Jun. 28, 2022, which is a continuation of U.S. patent application Ser. No. 16/538,629, filed Aug. 12, 2019, now U.S. Pat. No. 10,734,965, issued Aug. 4, 2020, which are incorporated herein by reference in their entireties.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 2B is a representation of a database for storing room response data and corresponding playback device calibration settings.

Figure 1A:
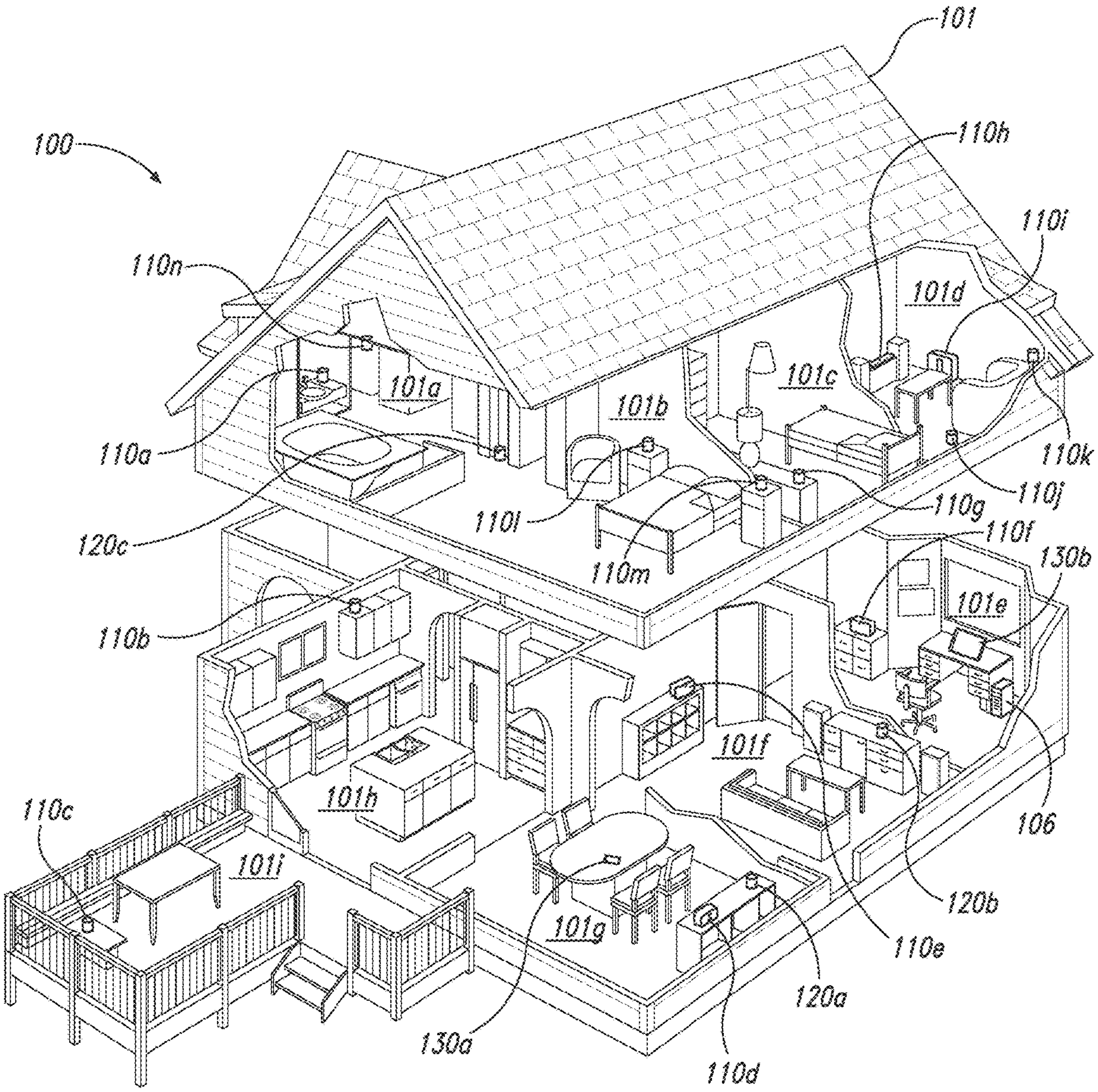
FIG. 1A is a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

Example techniques described herein relate to calibration of a portable playback device. Any environment has certain acoustic characteristics ("acoustics") that define how sound travels within that environment. For instance, with a room, the size and shape of the room, as well as objects inside that room, may define the acoustics for that room. For example, angles of walls with respect to a ceiling affect how sound reflects off the wall and the ceiling. As another example, furniture positioning in the room affects how the sound travels in the room. Various types of surfaces within the room may also affect the acoustics of that room; hard surfaces in the room may reflect sound, whereas soft surfaces may absorb sound.

Generally, changing a location of a playback device (e.g., by picking the playback device and setting it somewhere else) or rotating the playback device (e.g., to face a different direction) will cause output from a playback device to interact with the acoustic characteristics differently, as the response of environment acoustics to audio output of a playback device changes based on the positioning of the playback device. Accordingly, calibrating a playback device that is configured for portable use (where the playback device is more frequently re-positioned) may involve different considerations than calibrating a playback device that is expected to be generally stationary (e.g., on a bookshelf). Example calibration techniques described herein may be implemented in portable playback devices to facilitate calibration.

Given its portability, a portable playback device may be expected to change position and/or orientation relative to a listening environment relatively more frequently than a non-portable playback device (i.e., a wall-powered playback device). That is, to account for changing conditions of portable playback devices, a calibration process for a portable playback device may be initiated more frequently than, for example, a calibration process for a stationary playback device. In some examples, calibration of the portable playback device is initiated when the portable playback device is turned on, when the portable playback device plays music, or if the portable playback device has been moved to a new location.

To illustrate, if the portable playback device is moved to a new location, calibration of the portable playback device may be initiated based on a detection of the movement. Movement of the portable playback device may be detected by way of an accelerometer or, alternatively, based on a user input indicating that the portable playback device has moved to a new location. Conversely, calibration may be suspended when the portable playback device is in motion.

Further, in some examples, the portable playback device may be compatible with a playback device base. Placement or removal of the portable playback device on the playback device base may initiate or suspend calibration. In some examples, calibration of the playback device is initiated periodically, or after a threshold amount of time has elapsed after a previous calibration, in order to account for potential movement of the portable playback device and changes to the environment of the portable playback device. U.S. Pat. No. 9,544,701, entitled "Base Properties in a Media Playback System", hereby incorporated by reference in its entirety, provides examples of playback devices compatible with a base.

Example calibration processes, whether for a stationary or portable playback device, may involve a playback device outputting audio content while in a given environment (e.g., a room). The audio content may have predefined spectral content, such as a pink noise, a sweep, or a combination of content. Then, one or more microphones detect the outputted audio content to facilitate determining an acoustic response of the room (also referred to herein as a "room response").

In some examples, these microphones are located in a mobile device and the microphones detect outputted audio content at one or more different spatial positions in the room to facilitate determining an acoustic response of the room. In particular, a mobile device with a microphone, such as a smartphone or tablet (referred to herein as a network device) may be moved to the various locations in the room to detect the audio content. These locations may correspond to those locations where one or more listeners may experience audio playback during regular use (i.e., listening to) of the playback device. In this regard, the calibration process involves a user physically moving the network device to various locations in the room to detect the audio content at one or more spatial positions in the room. Given that this calibration involves moving the microphone to multiple locations throughout the room, this calibration may also be referred to as a "multi-location calibration" and it may generate a "multi-location acoustic response" representing room acoustics. U.S. Pat. No. 9,706,323 entitled, "Playback Device Calibration," U.S. Pat. No. 9,763,018 entitled, "Calibration of Audio Playback Devices,", and U.S. Pat. No. 10,299,061, entitled, "Playback Device Calibration," which are hereby incorporated by reference in their entirety, provide examples of multi-location calibration of playback devices to account for the acoustics of a room.

Based on a multi-location acoustic response, the media playback system may identify calibration settings (e.g., an audio processing algorithm). For instance, a network device may identify an audio processing algorithm, and transmit to the playback device, data indicating the identified audio processing algorithm. In some examples, the network device identifies an audio processing algorithm that, when applied to the playback device, results in audio content output by the playback device having a target audio characteristic, such as a target frequency response at one or more locations in the room.

The network device can identify the audio processing algorithm in various ways. In one case, the network device determines the audio processing algorithm based on the data indicating the detected audio content. In another case, the network device sends, to a computing device such as a server, data indicating the audio content detected at the various locations in the room, and receives, from the computing device, the audio processing algorithm after the server (or another computing device connected to the server) has determined the audio processing algorithm.

In some circumstances, performing a multi-location calibration process such as the one described above is not feasible or practical, particularly with respect to a portable playback device. For example, the portable playback device might not have access to a network device that is capable of or configured for performing such a calibration process. In some examples, the portable playback device may not have access to a network device at all. As such, the portable player must rely on its own processor and stored database to perform calibration. Further, in practice, a portable playback device may be relocated frequently and encounter changing environments and acoustic settings, as noted above.

As noted above, disclosed herein are example systems and methods to help address these or other issues with respect to calibration of portable playback devices. In particular, an example portable playback device in an environment may calibrate itself with respect to the environment without using a network device to detect audio content at various locations in the room and without leveraging a remote database. To do so, the playback device leverages one or more built-in microphones, and a locally-stored database of calibration settings (e.g., audio processing algorithms) and/or room responses (e.g. reference room responses) that includes a representation or generalization of previously generated data points for other playback devices using a calibration process, such as the process described above to determine a multi-location acoustic response.

The previously generated data points represent playback devices performing a multi-location calibration process similar to the process described above. Namely, the previously generated database is populated by performing the multi-location calibration process repeatedly in various locations in a plurality of different rooms or other listening environments (e.g., outdoors). To obtain a statistically sufficient collection of different room responses and corresponding calibration settings, this process can be performed by a large number of users in a larger number of different rooms. In some examples, an initial database may be built by designated individual (e.g., product testers) and refined over time by other users.

Since different playback devices have different output characteristics, these unique characteristics must be accounted for during the process of building the database. In some cases, the playback devices used in building the database are the portable playback devices themselves. Alternatively, a model can be developed to translate the output of other playback devices to represent the output of the portable playback devices.

As noted above, a portable playback device may include its own microphone(s). During the process of database building, the playback device uses its microphone(s) to record the audio output of the portable playback device concurrently with the recording by the microphones of the network device. This acoustic response determined by the playback device may be referred to as a "localized acoustic response," as the acoustic response is determined based on captured audio localized at the playback device, rather than at multiple locations throughout the room via the microphone of the network device. Such concurrent recording allows correlations to be made in the database between the localized acoustic responses detected by the microphone(s) in the playback device and the calibration settings based on the multi-location acoustic responses detected by the microphone(s) in the network device.

In practice, local storage of the entire collection of different room responses and corresponding calibration settings may not be feasible on portable playback devices, owing to cost and/or size considerations. As such, in example implementations, the portable playback device may include a generalization or representation of this larger remote database. Alternatively, a playback device may include a subset of the larger remote database.

In operation, after the database is built and stored locally on the playback device, the portable playback devices again use their own microphones to perform a self-calibration. In such a calibration, the portable playback device determines a localized acoustic response for the room by outputting audio content in the room and using a microphone of the playback device to detect reflections of the audio content within the room.

The playback device then queries the locally stored database to identify a stored localized acoustic response that is substantially similar to, or that is most similar to, the localized acoustic response determined by the playback device. In particular, the playback device may use the correlated localized responses to calculate or identify stored calibration settings corresponding to the instant determined localized acoustic response. The playback device then applies to itself the identified calibration settings that are associated in the database with the instant localized acoustic response.

In some implementations, for example, a playback device stores an acoustic response database comprising a plurality of sets of stored audio calibration settings, each set of stored audio calibration settings associated with a respective stored acoustic area response of a plurality of stored acoustic area responses. The playback device then determines that the playback device is to perform an equalization calibration of the playback device. In response to the determination that the playback device is to perform the equalization calibration, the playback device initiates the equalization calibration. The equalization calibration comprises (i) outputting, via the speaker, audio content (ii) capturing, via the microphone, audio data representing reflections of the audio content within an area in which the playback device is located (iii) based on at least the captured audio data, determining an acoustic response of the area in which the playback device is located, (iv) selecting a stored acoustic response from the acoustic response database that is most similar to the determined acoustic response of the area in which the playback device is located, and (v) applying to the audio content, a set of stored audio calibration settings associated with the selected stored acoustic area response.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110*a* is first introduced and discussed with reference to FIG. 1A. Many of the details, dimensions, angles and other features shown in the Figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110*a-n*), one or more network microphone devices ("NMDs") 120 (identified individually as NMDs 120*a-c*), and one or more control devices 130 (identified individually as control devices 130*a* and 130*b*).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the media playback system 100 is configured to play back audio from a first playback device (e.g., the playback device 100*a*) in synchrony with a second playback device (e.g., the playback device 100*b*). Interactions between the playback devices 110, NMDs 120, and/or control devices 130 of the media playback system 100 configured in accordance with the various embodiments of the disclosure are described in greater detail below with respect to FIGS. 1B-1H.

In the illustrated embodiment of FIG. 1A, the environment 101 comprises a household having several rooms, spaces, and/or playback zones, including (clockwise from upper left) a master bathroom 101*a*, a master bedroom 101*b*, a second bedroom 101*c*, a family room or den 101*d*, an office 101*e*, a living room 101*f*, a dining room 101*g*, a kitchen 101*h*, and an outdoor patio 101*i*. While certain embodiments and examples are described below in the context of a home environment, the technologies described herein may be implemented in other types of environments. In some embodiments, for example, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101*e*, master bathroom 101*a*, master bedroom 101*b*, the second bedroom 101*c*, kitchen 101*h*, dining room 101*g*, living room 101*f*, and/or the balcony 101*i*. In some aspects, a single playback zone may include multiple rooms or spaces. In certain aspects, a single room or space may include multiple playback zones.

In the illustrated embodiment of FIG. 1A, the master bathroom 101*a*, the second bedroom 101*c*, the office 101*e*, the living room 101*f*, the dining room 101*g*, the kitchen 101*h*, and the outdoor patio 101*i* each include one playback device 110, and the master bedroom 101*b* and the den 101*d* include a plurality of playback devices 110. In the master bedroom 101*b*, the playback devices 110*l* and 110*m* may be configured, for example, to play back audio content in synchrony as individual ones of playback devices 110, as a bonded playback zone, as a consolidated playback device, and/or any combination thereof. Similarly, in the den 101*d*, the playback devices 110*h-j* can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B and 1E.

In some aspects, one or more of the playback zones in the environment 101 may each be playing different audio content. For instance, a user may be grilling on the patio 101*i* and listening to hip hop music being played by the playback device 110*c* while another user is preparing food in the kitchen 101*h* and listening to classical music played by the playback device 110*b*. In another example, a playback zone may play the same audio content in synchrony with another playback zone. For instance, the user may be in the office 101*e* listening to the playback device 110*f* playing back the same hip hop music being played back by playback device 110*c* on the patio 101*i*. In some aspects, the playback devices 110*c* and 110*f* play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
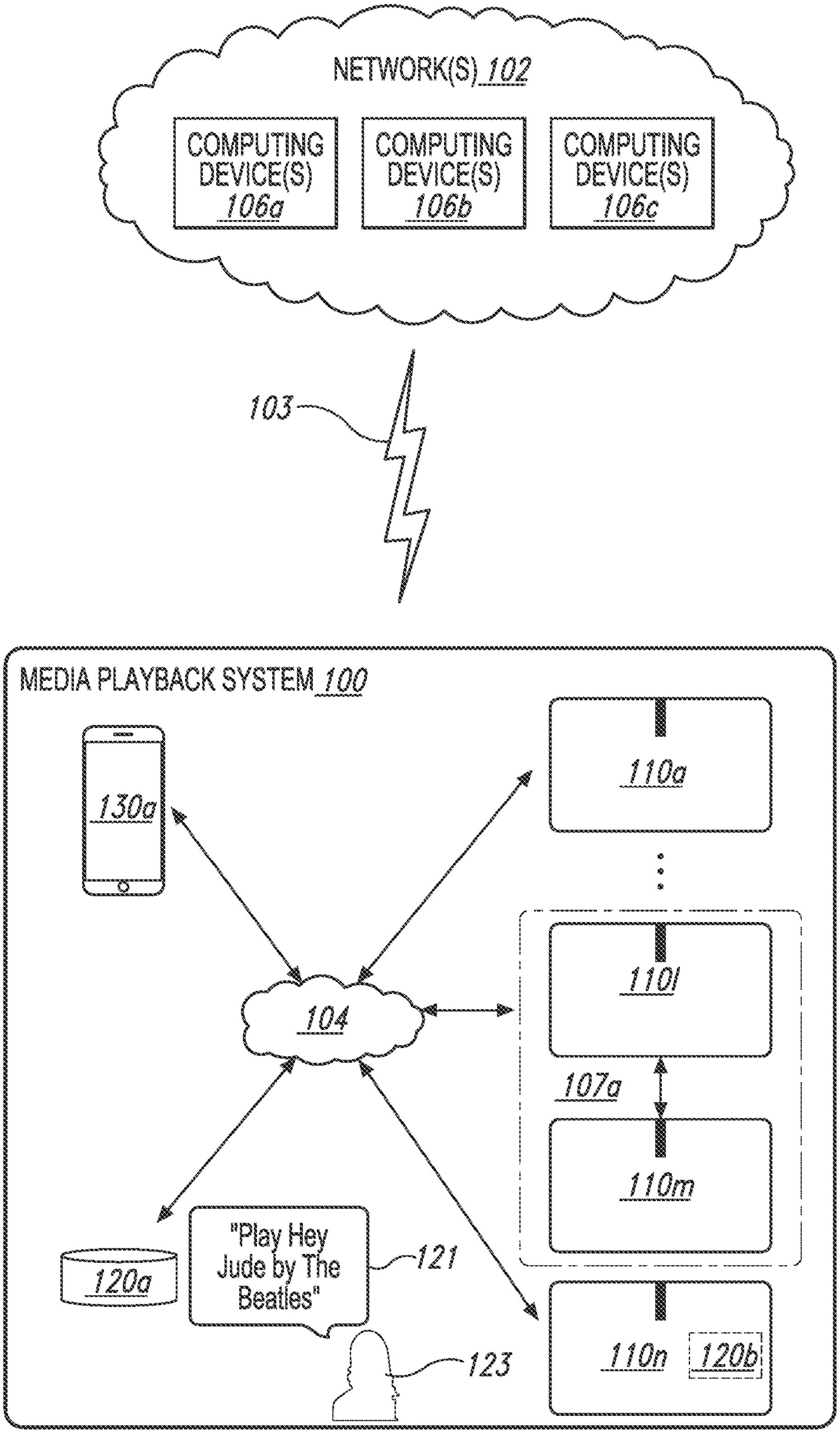
FIG. 1B is a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN), one or more local area networks (LAN), one or more personal area networks (PAN), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some embodiments, the cloud network 102 is further configured to receive data (e.g. voice input data) from the media playback system 100 and correspondingly transmit commands and/or media content to the media playback system 100.

The cloud network 102 comprises computing devices 106 (identified separately as a first computing device 106*a*, a second computing device 106*b*, and a third computing device 106*c*). The computing devices 106 can comprise individual computers or servers, such as, for example, a media streaming service server storing audio and/or other media content, a voice service server, a social media server, a media playback system control server, etc. In some embodiments, one or more of the computing devices 106 comprise modules of a single computer or server. In certain embodiments, one or more of the computing devices 106 comprise one or more modules, computers, and/or servers. Moreover, while the cloud network 102 is described above in the context of a single cloud network, in some embodiments the cloud network 102 comprises a plurality of cloud networks comprising communicatively coupled computing devices. Furthermore, while the cloud network 102 is shown in FIG. 1B as having three of the computing devices 106, in some embodiments, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Engineers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHZ, and/or another suitable frequency.

In some embodiments, the network 104 comprises a dedicated communication network that the media playback system 100 uses to transmit messages between individual devices and/or to transmit media content to and from media content sources (e.g., one or more of the computing devices 106). In certain embodiments, the network 104 is configured to be accessible only to devices in the media playback system 100, thereby reducing interference and competition with other household devices. In other embodiments, however, the network 104 comprises an existing household communication network (e.g., a household WiFi network). In some embodiments, the links 103 and the network 104 comprise one or more of the same networks. In some aspects, for example, the links 103 and the network 104 comprise a telecommunication network (e.g., an LTE network, a 5G network). Moreover, in some embodiments, the media playback system 100 is implemented without the network 104, and devices comprising the media playback system 100 can communicate with each other, for example, via one or more direct connections, PANs, telecommunication networks, and/or other suitable communication links.

In some embodiments, audio content sources may be regularly added or removed from the media playback system 100. In some embodiments, for example, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some embodiments, for example, the media content database is stored on one or more of the playback devices 110, network microphone devices 120, and/or control devices 130.

In the illustrated embodiment of FIG. 1B, the playback devices **110*l* and 110*m* comprise a group 107*a*. The playback devices 110*l* and 110*m* can be positioned in different rooms in a household and be grouped together in the group 107*a* on a temporary or permanent basis based on user input received at the control device 130*a* and/or another control device 130 in the media playback system 100. When arranged in the group 107*a*, the playback devices 110*l* and 110*m* can be configured to play back the same or similar audio content in synchrony from one or more audio content sources. In certain embodiments, for example, the group 107*a* comprises a bonded zone in which the playback devices 110*l* and 110*m* comprise left audio and right audio channels, respectively, of multi-channel audio content, thereby producing or enhancing a stereo effect of the audio content. In some embodiments, the group 107*a* includes additional playback devices 110. In other embodiments, however, the media playback system 100 omits the group 107*a* and/or other grouped arrangements of the playback devices 110**.

The media playback system 100 includes the NMDs **120*a* and 120*d*, each comprising one or more microphones configured to receive voice utterances from a user. In the illustrated embodiment of FIG. 1B, the NMD 120*a* is a standalone device and the NMD 120*d* is integrated into the playback device 110*n*. The NMD 120*a*, for example, is configured to receive voice input 121 from a user 123. In some embodiments, the NMD 120*a* transmits data associated with the received voice input 121 to a voice assistant service (VAS) configured to (i) process the received voice input data and (ii) transmit a corresponding command to the media playback system 100. In some aspects, for example, the computing device 106*c* comprises one or more modules and/or servers of a VAS (e.g., a VAS operated by one or more of SONOS®, AMAZON®, GOOGLE® APPLE®, MICROSOFT®). The computing device 106*c* can receive the voice input data from the NMD 120*a* via the network 104 and the links 103. In response to receiving the voice input data, the computing device 106*c* processes the voice input data (i.e., "Play Hey Jude by The Beatles"), and determines that the processed voice input includes a command to play a song (e.g., "Hey Jude"). The computing device 106*c* accordingly transmits commands to the media playback system 100 to play back "Hey Jude" by the Beatles from a suitable media service (e.g., via one or more of the computing devices 106) on one or more of the playback devices 110**.

b. Suitable Playback Devices

Figure 1C:
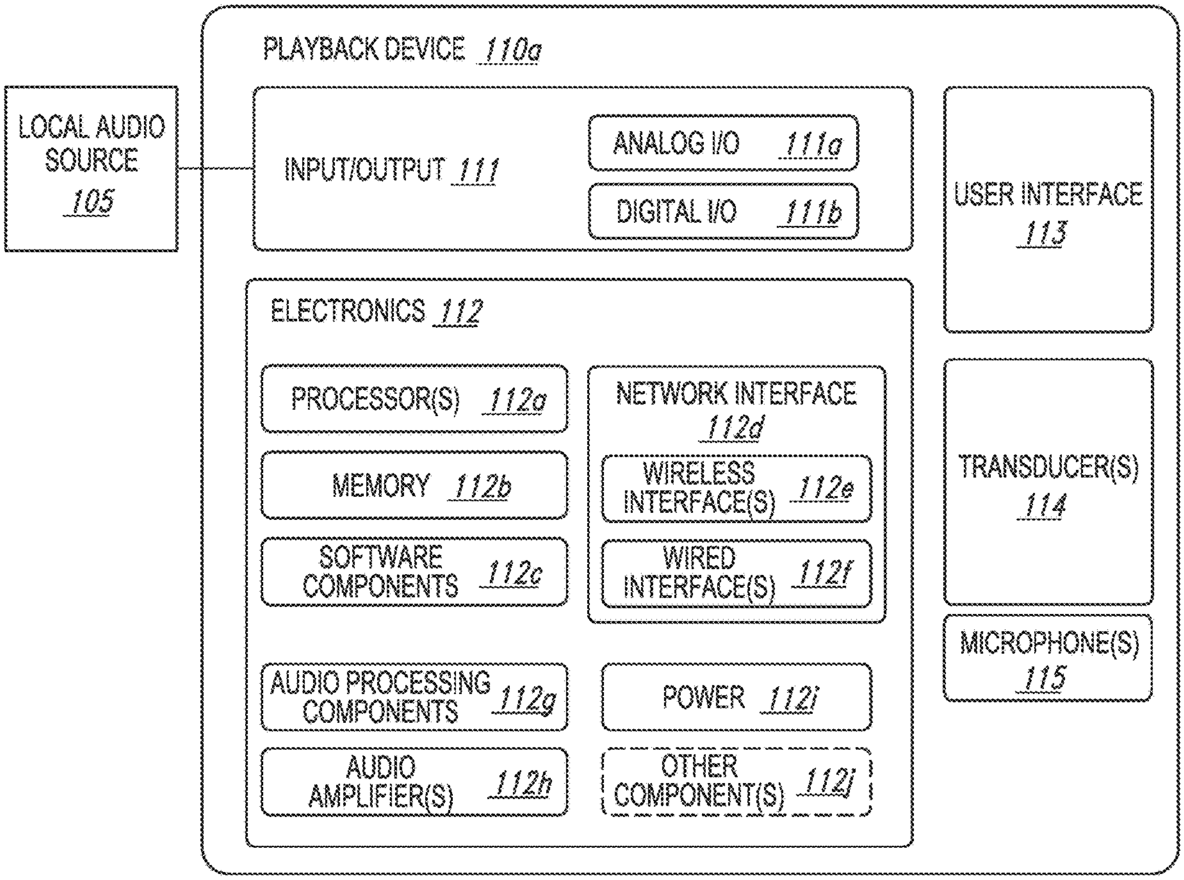
FIG. 1C is a block diagram of a playback device.

FIG. 1C is a block diagram of the playback device **110*a* comprising an input/output 111. The input/output 111 can include an analog I/O 111*a* (e.g., one or more wires, cables, and/or other suitable communication links configured to carry analog signals) and/or a digital I/O 111*b* (e.g., one or more wires, cables, or other suitable communication links configured to carry digital signals). In some embodiments, the analog I/O 111*a* is an audio line-in input connection comprising, for example, an auto-detecting 3.5 mm audio line-in connection. In some embodiments, the digital I/O 111*b* comprises a Sony/Philips Digital Interface Format (S/PDIF) communication interface and/or cable and/or a Toshiba Link (TOSLINK) cable. In some embodiments, the digital I/O 111*b* comprises a High-Definition Multimedia Interface (HDMI) interface and/or cable. In some embodiments, the digital I/O 111*b* includes one or more wireless communication links comprising, for example, a radio frequency (RF), infrared, WiFi, Bluetooth, or another suitable communication protocol. In certain embodiments, the analog I/O 111*a* and the digital 111*b*** comprise interfaces (e.g., ports, plugs, jacks) configured to receive connectors of cables transmitting analog and digital signals, respectively, without necessarily including cables.

The playback device **110*a*, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 105. In other embodiments, however, the media playback system omits the local audio source 105 altogether. In some embodiments, the playback device 110***a* does not include an input/output 111 and receives all audio content via the network 104.

The playback device 110*a* further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106*a-c* via the network 104 (FIG. 1B)), amplify the received audio, and output the amplified audio for playback via one or more of the transducers 114. In some embodiments, the playback device 110*a* optionally includes one or more microphones 115 (e.g., a single microphone, a plurality of microphones, a microphone array) (hereinafter referred to as "the microphones 115"). In certain embodiments, for example, the playback device 110*a* having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112*a* (referred to hereinafter as "the processors 112*a*"), memory 112*b*, software components 112*c*, a network interface 112*d*, one or more audio processing components 112*g* (referred to hereinafter as "the audio components 112*g*"), one or more audio amplifiers 112*h* (referred to hereinafter as "the amplifiers 112*h*"), and power 112*i* (e.g., one or more power supplies, power cables, power receptacles, batteries, induction coils, Power-over Ethernet (POE) interfaces, and/or other suitable sources of electric power). In some embodiments, the electronics 112 optionally include one or more other components 112*j* (e.g., one or more sensors, video displays, touchscreens, battery charging bases).

The processors 112*a* can comprise clock-driven computing component(s) configured to process data, and the memory 112*b* can comprise a computer-readable medium (e.g., a tangible, non-transitory computer-readable medium, data storage loaded with one or more of the software components 112*c*) configured to store instructions for performing various operations and/or functions. The processors 112*a* are configured to execute the instructions stored on the memory 112*b* to perform one or more of the operations. The operations can include, for example, causing the playback device 110*a* to retrieve audio data from an audio source (e.g., one or more of the computing devices 106*a-c* (FIG. 1B)), and/or another one of the playback devices 110. In some embodiments, the operations further include causing the playback device 110*a* to send audio data to another one of the playback devices 110*a* and/or another device (e.g., one of the NMDs 120). Certain embodiments include operations causing the playback device 110*a* to pair with another of the one or more playback devices 110 to enable a multi-channel audio environment (e.g., a stereo pair, a bonded zone).

The processors 112*a* can be further configured to perform operations causing the playback device 110*a* to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110*a* and the other one or more other playback devices 110. Additional details regarding audio playback synchronization among playback devices can be found, for example, in U.S. Pat. No. 8,234,395, which was incorporated by reference above.

In some embodiments, the memory 112*b* is further configured to store data associated with the playback device 110*a*, such as one or more zones and/or zone groups of which the playback device 110*a* is a member, audio sources accessible to the playback device 110*a*, and/or a playback queue that the playback device 110*a* (and/or another of the one or more playback devices) can be associated with. The stored data can comprise one or more state variables that are periodically updated and used to describe a state of the playback device 110*a*. The memory 112*b* can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112*d* is configured to facilitate a transmission of data between the playback device 110*a* and one or more other devices on a data network such as, for example, the links 103 and/or the network 104 (FIG. 1B). The network interface 112*d* is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112*d* can parse the digital packet data such that the electronics 112 properly receives and processes the data destined for the playback device 110*a*.

In the illustrated embodiment of FIG. 1C, the network interface 112*d* comprises one or more wireless interfaces 112*e* (referred to hereinafter as "the wireless interface 112*e*"). The wireless interface 112*e* (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some embodiments, the network interface 112*d* optionally includes a wired interface 112*f* (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112*d* includes the wired interface 112*f* and excludes the wireless interface 112*e*. In some embodiments, the electronics 112 excludes the network interface 112*d* altogether and transmits and receives media content and/or other data via another communication path (e.g., the input/output 111).

The audio components 112*g* are configured to process and/or filter data comprising media content received by the electronics 112 (e.g., via the input/output 111 and/or the network interface 112*d*) to produce output audio signals. In some embodiments, the audio processing components 112*g* comprise, for example, one or more digital-to-analog converters (DAC), audio preprocessing components, audio enhancement components, a digital signal processors (DSPs), and/or other suitable audio processing components, modules, circuits, etc. In certain embodiments, one or more of the audio processing components 112*g* can comprise one or more subcomponents of the processors 112*a*. In some embodiments, the electronics 112 omits the audio processing components 112*g*. In some aspects, for example, the processors 112*a* execute instructions stored on the memory 112*b* to perform audio processing operations to produce the output audio signals.

The amplifiers 112*h* are configured to receive and amplify the audio output signals produced by the audio processing components 112*g* and/or the processors 112*a*. The amplifiers 112*h* can comprise electronic devices and/or components configured to amplify audio signals to levels sufficient for driving one or more of the transducers 114. In some embodiments, for example, the amplifiers 112*h* include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112*h* comprise a suitable combination of two or more of the foregoing types of power amplifiers. Moreover, in some embodiments, individual ones of the amplifiers 112*h* correspond to individual ones of the transducers 114. In other embodiments, however, the electronics 112 includes a single one of the amplifiers 112*h* configured to output amplified audio signals to a plurality of the transducers 114. In some other embodiments, the electronics 112 omits the amplifiers 112*h*.

The transducers 114 (e.g., one or more speakers and/or speaker drivers) receive the amplified audio signals from the amplifier 112*h* and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

Figure 1D:
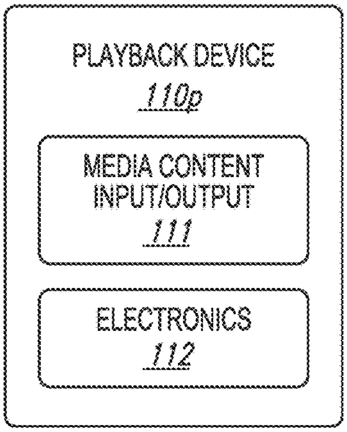
FIG. 1D is a block diagram of a playback device.

By way of illustration, SONOS, Inc. presently offers (or has offered) for sale certain playback devices including, for example, a "SONOS ONE," "PLAY: 1," "PLAY: 3," "PLAY: 5," "PLAYBAR," "PLAYBASE," "CONNECT: AMP," "CONNECT," and "SUB." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). In other embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110*p* comprising the input/output 111 and electronics 112 without the user interface 113 or transducers 114.

Figure 1E:
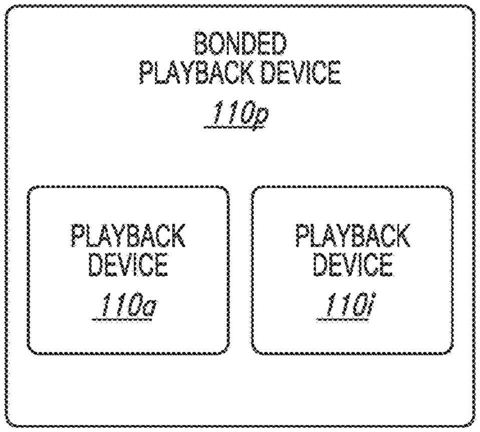
FIG. 1E is a block diagram of a network microphone device.

FIG. 1E is a block diagram of a bonded playback device 110*q* comprising the playback device 110*a* (FIG. 1C) sonically bonded with the playback device 110*i* (e.g., a subwoofer) (FIG. 1A). In the illustrated embodiment, the playback devices 110*a* and 110*i* are separate ones of the playback devices 110 housed in separate enclosures. In some embodiments, however, the bonded playback device 110*q* comprises a single enclosure housing both the playback devices 110*a* and 110*i*. The bonded playback device 110*q* can be configured to process and reproduce sound differently than an unbonded playback device (e.g., the playback device 110*a* of FIG. 1C) and/or paired or bonded playback devices (e.g., the playback devices 110*l* and 110*m* of FIG. 1B). In some embodiments, for example, the playback device 110*a* is full-range playback device configured to render low frequency, mid-range frequency, and high frequency audio content, and the playback device 110*i* is a subwoofer configured to render low frequency audio content. In some aspects, the playback device 110*a*, when bonded with the first playback device, is configured to render only the mid-range and high frequency components of a particular audio content, while the playback device 110*i* renders the low frequency component of the particular audio content. In some embodiments, the bonded playback device 110*q* includes additional playback devices and/or another bonded playback device.

c. Suitable Network Microphone Devices (NMDs)

Figure 1F:
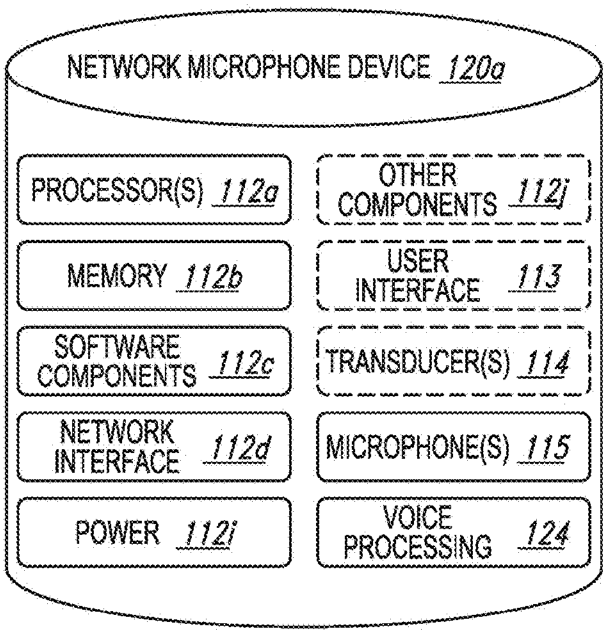
FIG. 1F is a block diagram of a network microphone device.

FIG. 1F is a block diagram of the NMD 120*a* (FIGS. 1A and 1B). The NMD 120*a* includes one or more voice processing components 124 (hereinafter "the voice components 124") and several components described with respect to the playback device 110*a* (FIG. 1C) including the processors 112*a*, the memory 112*b*, and the microphones 115. The NMD 120*a* optionally comprises other components also included in the playback device 110*a* (FIG. 1C), such as the user interface 113 and/or the transducers 114. In some embodiments, the NMD 120*a* is configured as a media playback device (e.g., one or more of the playback devices 110), and further includes, for example, one or more of the audio components 112*g* (FIG. 1C), the amplifiers 114, and/or other playback device components. In certain embodiments, the NMD 120*a* comprises an Internet of Things (IoT) device such as, for example, a thermostat, alarm panel, fire and/or smoke detector, etc. In some embodiments, the NMD 120*a* comprises the microphones 115, the voice processing 124, and only a portion of the components of the electronics 112 described above with respect to FIG. 1B. In some aspects, for example, the NMD 120*a* includes the processor 112*a* and the memory 112*b* (FIG. 1B), while omitting one or more other components of the electronics 112. In some embodiments, the NMD 120*a* includes additional components (e.g., one or more sensors, cameras, thermometers, barometers, hygrometers).

Figure 1G:
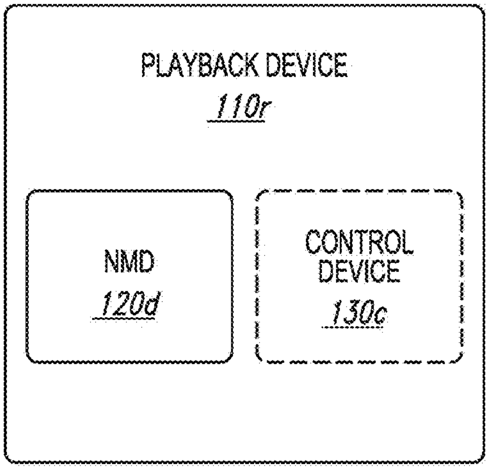
FIG. 1G is a block diagram of a playback device.

In some embodiments, an NMD can be integrated into a playback device. FIG. 1G is a block diagram of a playback device 110*r* comprising an NMD 120*d*. The playback device 110*r* can comprise many or all of the components of the playback device 110*a* and further include the microphones 115 and voice processing 124 (FIG. 1F). The playback device 110*r* optionally includes an integrated control device 130*c*. The control device 130*c* can comprise, for example, a user interface (e.g., the user interface 113 of FIG. 1B) configured to receive user input (e.g., touch input, voice input) without a separate control device. In other embodiments, however, the playback device 110*r* receives commands from another control device (e.g., the control device 130*a* of FIG. 1B).

Referring again to FIG. 1F, the microphones 115 are configured to acquire, capture, and/or receive sound from an environment (e.g., the environment 101 of FIG. 1A) and/or a room in which the NMD 120*a* is positioned. The received sound can include, for example, vocal utterances, audio played back by the NMD 120*a* and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home.

d. Suitable Control Devices

Figure 1H:
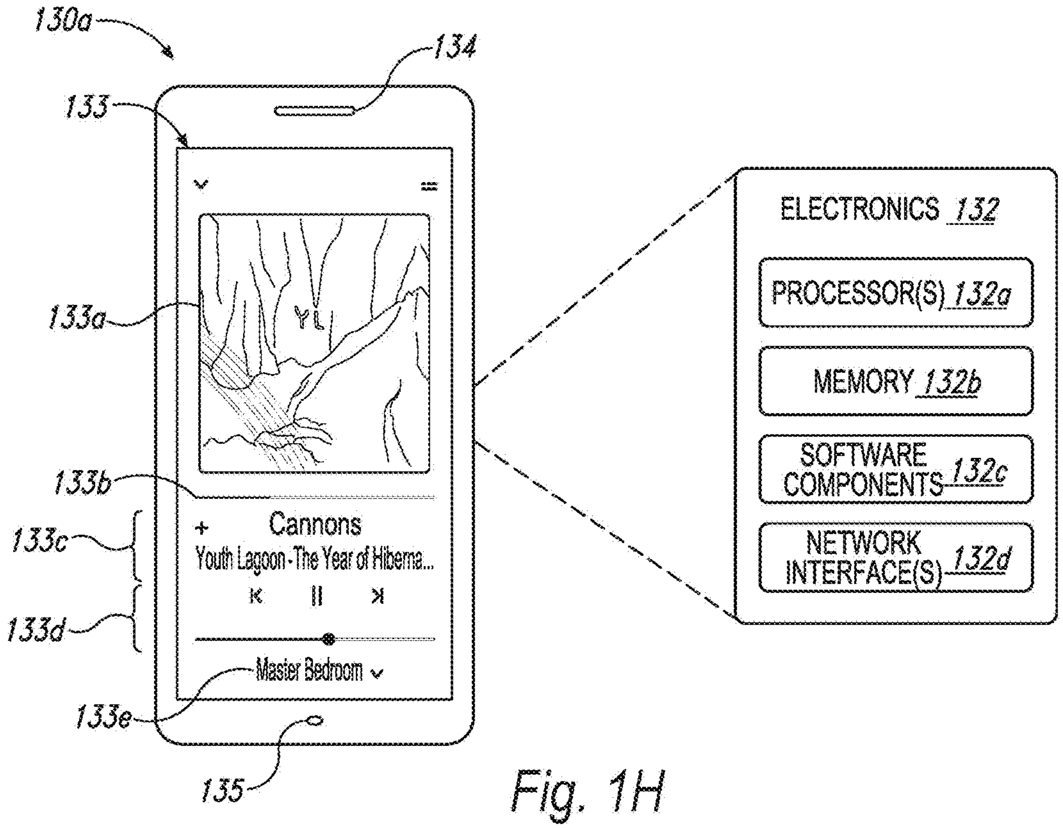
FIG. 1H is a partially schematic diagram of a control device.

FIG. 1H is a partially schematic diagram of the control device 130*a* (FIGS. 1A and 1B). As used herein, the term "control device" can be used interchangeably with "controller" or "control system." Among other features, the control device 130*a* is configured to receive user input related to the media playback system 100 and, in response, cause one or more devices in the media playback system 100 to perform an action(s) or operation(s) corresponding to the user input. In the illustrated embodiment, the control device 130*a* comprises a smartphone (e.g., an iPhone™, an Android phone) on which media playback system controller application software is installed. In some embodiments, the control device 130*a* comprises, for example, a tablet (e.g., an iPad™), a computer (e.g., a laptop computer, a desktop computer), and/or another suitable device (e.g., a television, an automobile audio head unit, an IoT device). In certain embodiments, the control device 130*a* comprises a dedicated controller for the media playback system 100. In other embodiments, as described above with respect to FIG. 1G, the control device 130*a* is integrated into another device in the media playback system 100 (e.g., one more of the playback devices 110, NMDs 120, and/or other suitable devices configured to communicate over a network).

The control device 130*a* includes electronics 132, a user interface 133, one or more speakers 134, and one or more microphones 135. The electronics 132 comprise one or more processors 132*a* (referred to hereinafter as "the processors 132*a*"), a memory 132*b*, software components 132*c*, and a network interface 132*d*. The processor 132*a* can be configured to perform functions relevant to facilitating user access, control, and configuration of the media playback system 100. The memory 132*b* can comprise data storage that can be loaded with one or more of the software components executable by the processor 132*a* to perform those functions. The software components 132*c* can comprise applications and/or other executable software configured to facilitate control of the media playback system 100. The memory 112*b* can be configured to store, for example, the software components 132*c*, media playback system controller application software, and/or other data associated with the media playback system 100 and the user.

The network interface 132*d* is configured to facilitate network communications between the control device 130*a* and one or more other devices in the media playback system 100, and/or one or more remote devices. In some embodiments, the network interface 132 is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132*d* can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132*d* can transmit a playback device control command (e.g., volume control, audio playback control, audio content selection) from the control device 130*a* to one or more of the playback devices 100. The network interface 132*d* can also transmit and/or receive configuration changes such as, for example, adding/removing one or more playback devices 100 to/from a zone, adding/removing one or more zones to/from a zone group, forming a bonded or consolidated player, separating one or more playback devices from a bonded or consolidated player, among others.

The user interface 133 is configured to receive user input and can facilitate 'control of the media playback system 100. The user interface 133 includes media content art 133*a* (e.g., album art, lyrics, videos), a playback status indicator 133*b* (e.g., an elapsed and/or remaining time indicator), media content information region 133*c*, a playback control region 133*d*, and a zone indicator 133*e*. The media content information region 133*c* can include a display of relevant information (e.g., title, artist, album, genre, release year) about media content currently playing and/or media content in a queue or playlist. The playback control region 133*d* can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133*d* may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130*a*. In some embodiments, the one or more speakers comprise individual transducers configured to correspondingly output low frequencies, mid-range frequencies, and/or high frequencies. In some aspects, for example, the control device 130*a* is configured as a playback device (e.g., one of the playback devices 110). Similarly, in some embodiments the control device 130*a* is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130*a* is configured to operate as playback device and an NMD. In other embodiments, however, the control device 130*a* omits the one or more speakers 134 and/or the one or more microphones 135. For instance, the control device 130*a* may comprise a device (e.g., a thermostat, an IoT device, a network device) comprising a portion of the electronics 132 and the user interface 133 (e.g., a touch screen) without any speakers or microphones.

III. Example Systems and Methods for Calibrating a Playback Device

As discussed above, in some examples, a playback device is configured to calibrate itself to offset (or otherwise account for) an acoustic response of a room in which the playback device is located. The playback device performs this self-calibration by leveraging a database that is populated with calibration settings and/or reference room responses that were determined for a number of other playback devices. In some embodiments, the calibration settings and/or reference room responses stored in the database are determined based on multi-location acoustic responses for the rooms of the other playback devices recorded previously on mobile devices, such as a smart phone or tablet.

Figure 2A:
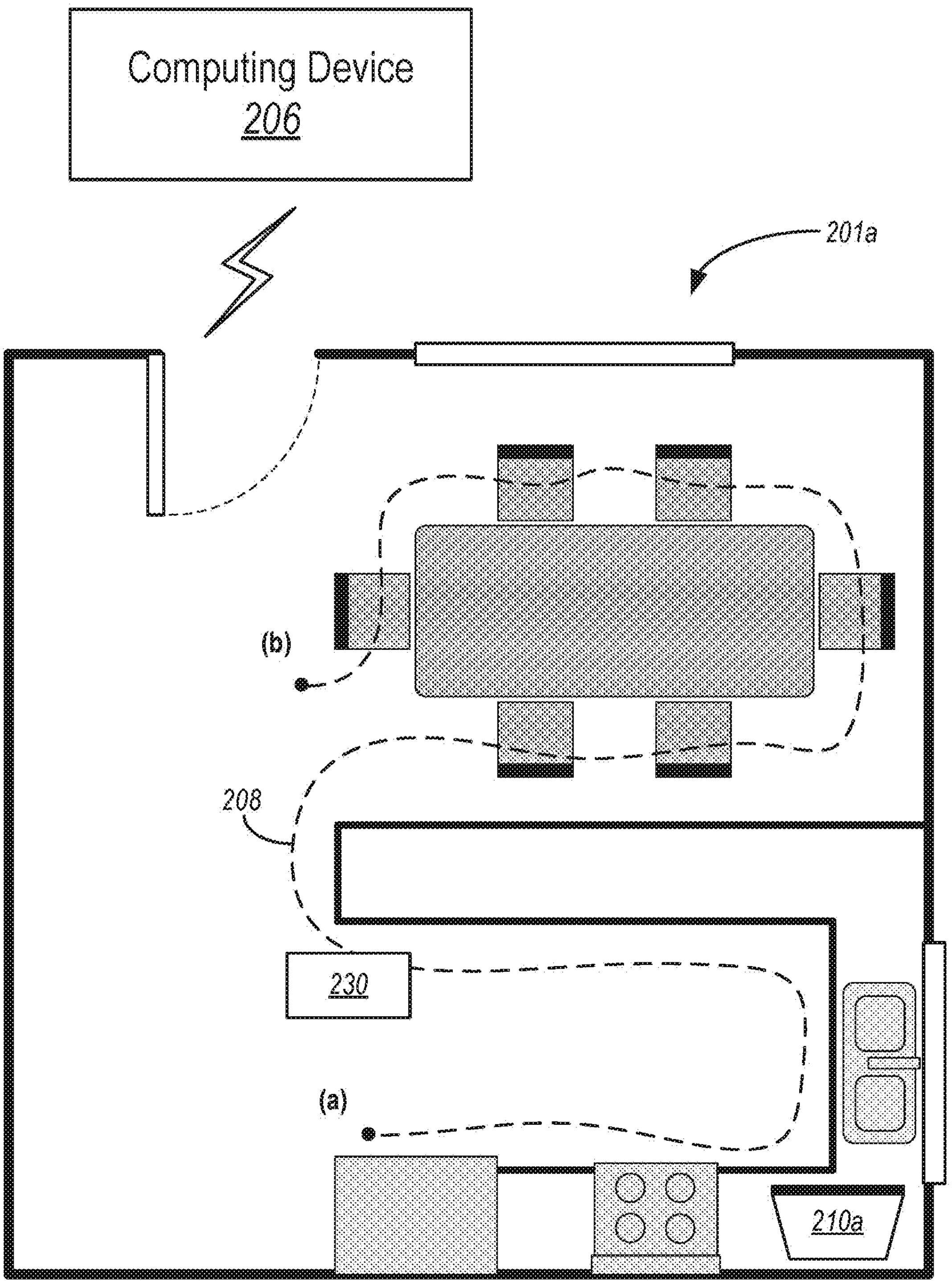
FIG. 2A is a diagram of a playback environment within which a playback device may be calibrated.

FIG. 2A depicts an example environment for using a multi-location acoustic response of a room to determine calibration settings for a playback device. As shown in FIG. 2A, a playback device 210*a* and a network device 230 are located in a room 201*a*. The playback device 210*a* may be similar to any of the playback devices 110 depicted in FIGS. 1A-1E and 1G, and the network device 230 may be similar to any of the NMDs 120 or controllers 130 depicted in FIGS. 1A-1B and 1F-1H. One or both of the playback device 210*a* and the network device 230 are in communication, either directly or indirectly, with a computing device 206. The computing device 206 may be similar to any of the computing devices 106 depicted in FIG. 1B. For instance, the computing device 206 may be a server located remotely from the room 201*a* and connected to the playback device 210*a* and/or the network device 230 over a wired or wireless communication network.

In practice, the playback device 210*a* outputs audio content via one or more transducers (e.g., one or more speakers and/or speaker drivers) of the playback device 210*a*. In one example, the audio content is output using a test signal or measurement signal representative of audio content that may be played by the playback device 210*a* during regular use by a user. Accordingly, the audio content may include content with frequencies substantially covering a renderable frequency range of the playback device 210*a* or a frequency range audible to a human. In one case, the audio content is output using an audio signal designed specifically for use when calibrating playback devices such as the playback device 210*a* being calibrated in examples discussed herein. In another case, the audio content is an audio track that is a favorite of a user of the playback device 210*a*, or a commonly played audio track by the playback device 210*a*. Other examples are also possible.

While the playback device 210*a* outputs the audio content, the network device 230 moves to various locations within the room 201*a*. For instance, the network device 230 may move between a first physical location and a second physical location within the room 201*a*. As shown in FIG. 2A, the first physical location may be the point (a), and the second physical location may be the point (b). While moving from the first physical location (a) to the second physical location (b), the network device 230 may traverse locations within the room 201*a* where one or more listeners may experience audio playback during regular use of the playback device 210*a*. For instance, as shown, the room 201*a* includes a kitchen area and a dining area, and a path 208 between the first physical location (a) and the second physical location (b) covers locations within the kitchen area and dining area where one or more listeners may experience audio playback during regular use of the playback device 210*a*.

In some examples, movement of the network device 230 between the first physical location (a) and the second physical location (b) may be performed by a user. In one case, a graphical display of the network device 230 may provide an indication to move the network device 230 within the room 201*a*. For instance, the graphical display may display text, such as "While audio is playing, please move the network device through locations within the playback zone where you or others may enjoy music." Other examples are also possible.

The network device 230 determines a multi-location acoustic response of the room 201*a*. To facilitate this, while the network device 230 is moving between physical locations within the room 201*a*, the network device 230 captures audio data representing reflections of the audio content output by the playback device 210*a* in the room 201*a*. For instance, the network device 230 may be a mobile device with a built-in microphone (e.g., microphone(s) 115 of network microphone device 120*a*), and the network device 230 may use the built-in microphone to capture the audio data representing reflections of the audio content at multiple locations within the room 201*a*.

The multi-location acoustic response is an acoustic response of the room 201*a* based on the detected audio data representing reflections of the audio content at multiple locations in the room 201*a*, such as at the first physical location (a) and the second physical location (b). The multi-location acoustic response may be represented as a spectral response, spatial response, or temporal response, among others. The spectral response may be an indication of how volume of audio sound captured by the microphone varies with frequency within the room 201*a*.

A power spectral density is an example representation of the spectral response. The spatial response may indicate how the volume of the audio sound captured by the microphone varies with direction and/or spatial position in the room 201*a*. The temporal response may be an indication of how audio sound played by the playback device 210*a*, e.g., an impulse sound or tone played by the playback device 210*a*, changes within the room 201*a*. The change may be characterized as a reverberation, delay, decay, or phase change of the audio sound.

The responses may be represented in various forms. For instance, the spatial response and temporal responses may be represented as room averages. Additionally, or alternatively, the multi-location acoustic response may be represented as a set of impulse responses or bi-quad filter coefficients representative of the acoustic response, among others. Values of the multi-location acoustic response may be represented in vector or matrix form.

Audio played by the playback device 210*a* is adjusted based on the multi-location acoustic response of the room 201*a* so as to offset or otherwise account for acoustics of the room 201*a* indicated by the multi-location acoustic response. In particular, the multi-location acoustic response is used to identify calibration settings, which may include determining an audio processing algorithm. U.S. Pat. No. 9,706,323, incorporated by reference above, discloses various audio processing algorithms, which are contemplated herein.

In some examples, determining the audio processing algorithm involves determining an audio processing algorithm that, when applied to the playback device 210*a*, causes audio content output by the playback device 210*a* in the room 201*a* to have a target frequency response. For instance, determining the audio processing algorithm may involve determining frequency responses at the multiple locations traversed by the network device while moving within the room 201*a* and determining an audio processing algorithm that adjusts the frequency responses at those locations to more closely reflect target frequency responses. In one example, if one or more of the determined frequency responses has a particular audio frequency that is more attenuated than other frequencies, then determining the audio processing algorithm may involve determining an audio processing algorithm that increases amplification at the particular audio frequency. Other examples are possible as well.

In some examples, the audio processing algorithm takes the form of a filter or equalization. The filter or equalization may be applied by the playback device 210*a* (e.g., via audio processing components 112*g*). Alternatively, the filter or equalization may be applied by another playback device, the computing device 206, and/or the network device 230, which then provides the processed audio content to the playback device 210*a* for output. The filter or equalization may be applied to audio content played by the playback device 210*a* until such time that the filter or equalization is changed or is no longer valid for the room 201*a*.

The audio processing algorithm may be stored in a database of the computing device 206 or may be calculated dynamically. For instance, in some examples, the network device 230 sends to the computing device 206 the detected audio data representing reflections of the audio content at multiple locations in the room 201*a*, and receives, from the computing device 206, the audio processing algorithm after the computing device 206 has determined the audio processing algorithm. In other examples, the network device 230 determines the audio processing algorithm based on the detected audio data representing reflections of the audio content at multiple locations in the room 201*a*.

Further, while the network device 230 captures audio data at multiple locations in the room 201*a* for determining the multi-location acoustic response of the room 201*a*, the playback device 210*a* concurrently captures audio data at a stationary location for determining a localized acoustic response of the room 201*a*. To facilitate this, the playback device 210*a* may have one or more microphones, which may be fixed in location. For example, the one or more microphones may be co-located in or on the playback device 210*a* (e.g., mounted in a housing of the playback device) or be co-located in or on an NMD proximate to the playback device 210*a*. Additionally, the one or more microphones may be oriented in one or more directions. The one or more microphones detect audio data representing reflections of the audio content output by the playback device 210*a* in the room 201*a*, and this detected audio data is used to determine the localized acoustic response of the room 201*a*.

The localized acoustic response is an acoustic response of the room 201*a* based on the detected audio data representing reflections of the audio content at a stationary location in the room. The stationary location may be at the one or more microphones located on or proximate to the playback device 210*a*, but could also be at the microphone of an NMD or a controller device proximate to the playback device 210*a*.

The localized acoustic response may be represented as a spectral response, spatial response, or temporal response, among others. The spectral response may be an indication of how volume of audio sound captured by the microphone varies with frequency within the room 201*a*. A power spectral density is an example representation of the spectral response. The spatial response may indicate how the volume of the audio sound captured by the microphone varies with direction and/or spatial position in the room 201*a*. The temporal response may be an indication of how audio sound played by the playback device 210*a*, e.g., an impulse sound or tone played by the playback device 210*a*, changes within the room 201*a*. The change may be characterized as a reverberation, delay, decay, or phase change of the audio sound. The spatial response and temporal response may be represented as averages in some instances. Additionally, or alternatively, the localized acoustic response may be represented as a set of impulse responses or bi-quad filter coefficients representative of the acoustic response, among others. Values of the localized acoustic response may be represented in vector or matrix form.

Once the multi-location calibration settings for the playback device 210*a* and the localized acoustic response of the room 201*a* are determined, this data is then provided to a computing device, such as computing device 206, for storage in a database. For instance, the network device 230 may send the determined multi-location calibration settings to the computing device 206, and the playback device 210*a* may send the localized acoustic response of the room 201*a* to the computing device 206. In other examples, the network device 230 or the playback device 210*a* sends both the determined multi-location calibration settings and the localized acoustic response of the room 201*a* to the computing device 206. Other examples are possible as well.

FIG. 2B depicts a representation of an example database 250*a* for storing both the determined multi-location calibration settings for the playback device 210*a* and the localized acoustic response of the room 201*a*.

The database 250*a* may be stored on a computing device, such as computing device 206, located remotely from the playback device 210*a* and/or from the network device 230, or the database 250*a* may be stored on the playback device 210*a* and/or the network device 230. The database 250*a* includes a number of records, and each record includes data representing multi-location calibrations settings (identified as "settings 1" through "settings 5") for various playback devices as well as localized room responses (identified as "response 1A" through "response 5A"), and multi-location acoustic responses (identified as "response 1B through "response 5B), associated with the multi-location calibration settings. For the purpose of illustration, the database 250*a* only depicts five records (numbered 1-5), but in practice should include many more than five records to improve the accuracy of the calibration processes described in further detail below.

When the computing device 206 receives data representing the multi-location calibration settings for the playback device 210*a* and data representing the localized acoustic response of the room 201*a*, the computing device 206 stores the received data in a record of the database 250*a*. As an example, the computing device 206 stores the received data in record #1 of the database 250*a*, such that "response 1" includes data representing the localized acoustic response of the room 201*a*, and "settings 1" includes data representing the multi-location calibration settings for the playback device 210*a*. In some cases, the database 250*a* also includes data representing respective multi-location acoustic responses associated with the localized acoustic responses and the corresponding multi-location calibration settings. For instance, if record #1 of database 250*a* corresponds to playback device 210*a*, then "response 1" may include data representing both the localized acoustic response of the room 201*a* and the multi-location acoustic response of the room 201*a*.

As indicated above, each record of the database 250*a* corresponds to a historical playback device calibration process in which a particular playback device was calibrated by determining calibration settings based on a multi-location acoustic response, as described above in connection with FIG. 2A. The calibration processes are "historical" in the sense that they relate to multi-location calibration settings and localized acoustic responses determined for rooms with various types of acoustic characteristics previously determined and stored in the database 250*a*. As additional iterations of the calibration process are performed, the resulting multi-location calibration settings and localized acoustic responses may be added to the database 250*a*.

As shown in the database 250*a*, the localized room response and the calibration settings based on the multi-location calibration are correlated. In operation, portable playback devices may leverage the historical multi-location calibration settings and localized acoustic responses stored in the database 250*a* in order to self-calibrate to account for the acoustic responses of the rooms in which they are located. During calibration of a portable playback device, the portable playback device uses its internal microphone(s) to record its own audio output and determines an instant localized response. This instant localized response can be compared to the localized room responses to determine a similar localized room response (i.e., a response that most similar), and thereby identify corresponding calibration settings based on a multi-location calibration. The playback device then applies to itself the multi-location calibration settings stored in the database 250*a* that are associated with the identified record.

Efficacy of the applied calibration settings is influenced by a degree of similarity between the identified stored acoustic response in the database 250*a* and the determined acoustic response for the playback device being calibrated. In particular, if the acoustic responses are significantly similar or identical, then the applied calibration settings are more likely to accurately offset or otherwise account for an acoustic response of the room in which the playback device being calibrated is located (e.g., by achieving or approaching a target frequency response in the room, as described above). On the other hand, if the acoustic responses are relatively dissimilar, then the applied calibration settings are less likely to accurately account for an acoustic response of the room in which the playback device being calibrated is located. Accordingly, populating the database 250*a* with records corresponding to a significantly large number of historical calibration processes may be desirable so as to increase the likelihood of the database 250*a* including acoustic response data similar to an acoustic response of the room of the playback device presently being calibrated.

As further shown, in some examples, the database 250*a* includes data identifying a type of a playback device associate with each record. Playback device "type" refers to a model and/or revision of a model, as well as different models that are designed to produce similar audio output (e.g., playback devices with similar components), among other examples. The type of the playback device may be indicated when providing the calibration settings and room response data to the database 250*a*. As an example, in addition to the network device 230 and/or the playback device 210*a* sending data representing the multi-location calibration settings for the playback device 210*a* and data representing the localized acoustic response of the room 201*a* to the computing device 206, the network device 230 and/or the playback device 210*a* also sends data representing a type of the playback device 210*a* to the computing device. Examples of playback device types offered by Sonos, Inc. include, by way of illustration, various models of playback devices such as a "SONOS ONE," "PLAY: 1," "PLAY: 3," "PLAY: 5," "PLAYBAR," "PLAYBASE," "CONNECT: AMP," "CONNECT," and "SUB," among others.

In some examples, the data identifying the type of the playback device additionally or alternatively includes data identifying a configuration of the playback device. For instance, as described above in connection with FIG. 1E, a playback device may be a bonded or paired playback device configured to process and reproduce sound differently than an unbonded or unpaired playback device. Accordingly, in some examples, the data identifying the type of the playback device 210*a* includes data identifying whether the playback device 210*a* is in a bonded or paired configuration.

By storing in the database 250*a* data identifying the type of the playback device, the database 250*a* may be more quickly searched by filtering data based on playback device type, as described in further detail below. However, in some examples, the database 250*a* does not include data identifying the device type of the playback device associated with each record.

In some implementations, calibrations settings for a first type of playback device may be used for a second type of playback device, provided that a model is created to translate from the first type to the second type. The model may include a transfer function that transfers a response of a first type of playback device to a response of a second type of playback device. Such models may be determined by comparing responses of the two types of playback devices in an anechoic chamber and determining a transfer function that translates between the two responses.

Figure 2C:
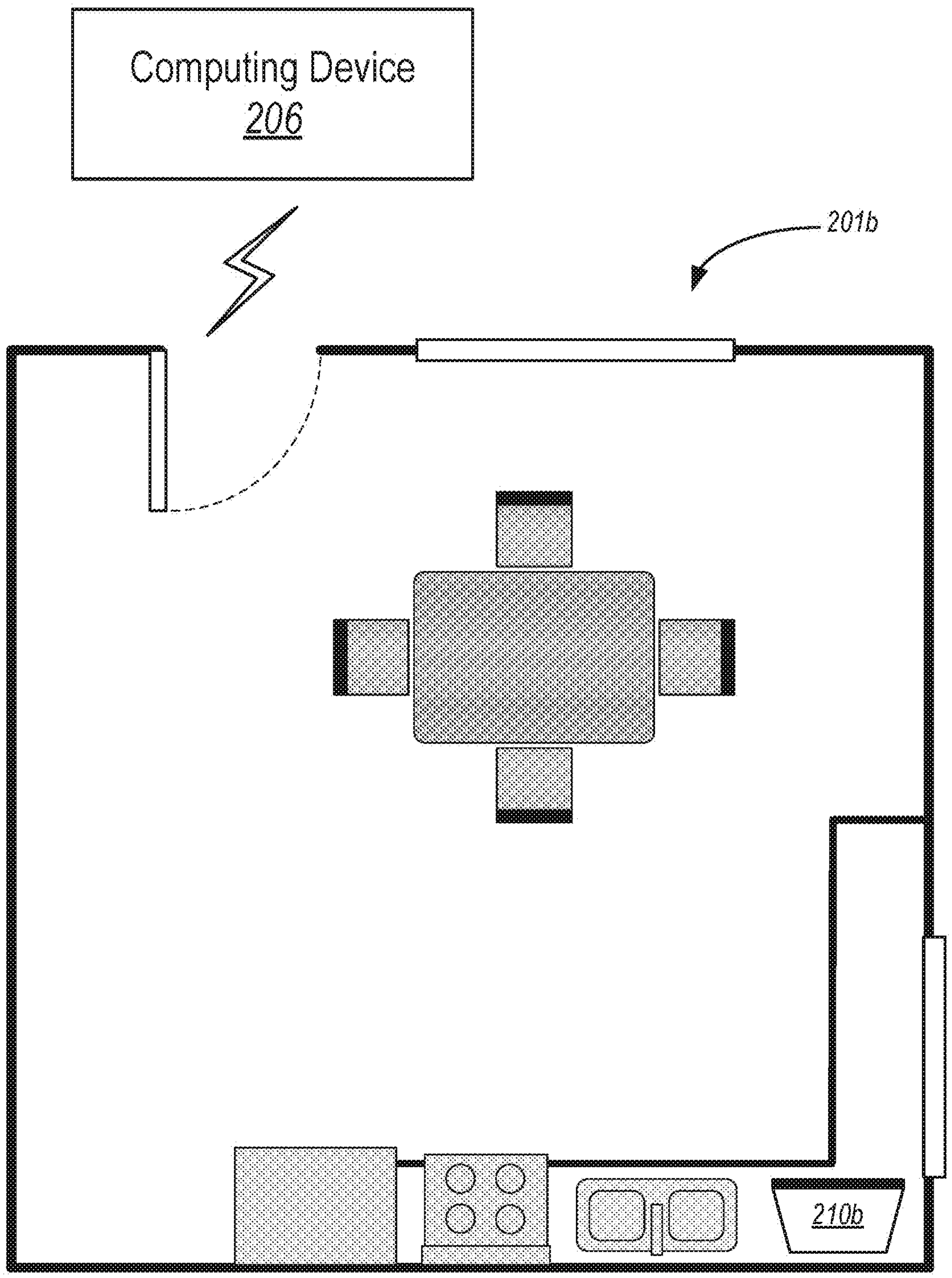
FIG. 2C is a diagram of a playback environment within which a playback device may be calibrated.

FIG. 2C depicts an example environment in which a playback device 210*b* leverages the database 250*a* to perform a self-calibration process without determining a multi-location acoustic response of its room 201*b*.

In one example, the self-calibration of the playback device 210*b* may be initiated when the playback device 210*b* is being set up for the first time in the room 201*b*, when the playback device 210*b* first outputs music or some other audio content, or if the playback device 210*b* has been moved to a new location. For instance, if the playback device 210*b* is moved to a new location, calibration of the playback device 210*b* may be initiated based on a detection of the movement (e.g., via a global positioning system (GPS), one or more accelerometers, or wireless signal strength variations), or based on a user input indicating that the playback device 210*b* has moved to a new location (e.g., a change in playback zone name associated with the playback device 210*b*).

In another example, calibration of the playback device 210*b* may be initiated via a controller device, such as the controller device 130*a* depicted in FIG. 1H. For instance, a user may access a controller interface for the playback device 210*b* to initiate calibration of the playback device 210*b*. In one case, the user may access the controller interface, and select the playback device 210*b* (or a group of playback devices that includes the playback device 210*b*) for calibration. In some cases, a calibration interface may be provided as part of a playback device controller interface to allow a user to initiate playback device calibration. Other examples are also possible.

Further, in some examples, calibration of the playback device 210*b* is initiated periodically, or after a threshold amount of time has elapsed after a previous calibration, in order to account for changes to the environment of the playback device 210*b*. For instance, a user may change a layout of the room 201*b* (e.g., by adding, removing, or rearranging furniture), thereby altering the acoustic response of the room 201*b*. As a result, any calibration settings applied to the playback device 210*b* before the room 201*b* is altered may have a reduced efficacy of accounting for, or offsetting, the altered acoustic response of the room 201*b*. Initiating calibration of the playback device 210*b* periodically, or after a threshold amount of time has elapsed after a previous calibration, can help address this issue by updating the calibration settings at a later time (i.e., after the room 201*b* is altered) so that the calibration settings applied to the playback device 210*b* are based on the altered acoustic response of the room 201*b*.

Additionally, because calibration of the playback device 210*b* involves accessing and retrieving calibration settings from the database 250*a*, as described in further detail below, initiating calibration of the playback device 210*b* periodically, or after a threshold amount of time has elapsed after a previous calibration, may further improve a listening experience in the room 201*b* by accounting for changes to the database 250*a*. For instance, as users continue to calibrate various playback devices in various rooms, the database 250*a* continues to be updated with additional acoustic room responses and corresponding calibration settings. As such, a newly added acoustic response (i.e., an acoustic response that is added to the database 250*a* after the playback device 210*b* has already been calibrated) may more closely resemble the acoustic response of the room 201*b*.

Thus, by initiating calibration of the playback device 210*b* periodically, or after a threshold amount of time has elapsed after a previous calibration, the calibration settings corresponding to the newly added acoustic response may be applied to the playback device 210*b*. Accordingly, in some examples, the playback device 210*b* determines that at least a threshold amount of time has elapsed after the playback device 210*b* has been calibrated, and, responsive to making such a determination, the playback device 210*b* initiates a calibration process, such as the calibration processes described below.

When performing the calibration process, the playback device 210*b* outputs audio content and determines a localized acoustic response of its room 201*b* similarly to how playback device 210*a* determined a localized acoustic response of room 201*a*. For instance, the playback device 210*b* outputs audio content, which may include music or one or more predefined tones, captures audio data representing reflections of the audio content within the room 201*b*, and determines the localized acoustic response based on the captured audio data.

Causing the playback device 210*b* to output spectrally rich audio content during the calibration process may yield a more accurate localized acoustic response of the room 201*b*. Thus, in examples where the audio content includes predefined tones, the playback device 210*b* may output predefined tones over a range of frequencies for determining the localized acoustic response of the room 201*b*. And in examples where the audio content includes music, such as music played during normal use of the playback device 210*b*, the playback device 210*b* may determine the localized acoustic response based on audio data that is captured over an extended period of time.

For instance, as the playback device 210*b* outputs music, the playback device 210*b* may continue to capture audio data representing reflections of the output music within the room 201*b* until a threshold amount of data at a threshold amount of frequencies is captured. Depending on the spectral content of the output music, the playback device 210*b* may capture the reflected audio data over the course of multiple songs, for instance, in order for the playback device 210*b* to have captured the threshold amount of data at the threshold amount of frequencies. In this manner, the playback device 210*b* gradually learns the localized acoustic response of the room 201*b*, and once a threshold confidence in understanding of the localized acoustic response of the room 201*b* is met, then the playback device 210*b* uses the localized acoustic response of the room 201*b* to determine calibration settings for the playback device 210*b*, as described in further detail below.

While outputting the audio content, the playback device 210*b* uses one or more stationary microphones, which may be disposed in or on a housing of the playback device 210*b* or may be co-located in or on an NMD proximate to the playback device 210*b*, to capture audio data representing reflections of the audio content in the room 201*b*. The playback device 210*b* then uses the captured audio data to determine the localized acoustic response of the room 201*b*. In line with the discussion above, the localized acoustic response may include a spectral response, spatial response, or temporal response, among others, and the localized acoustic response may be represented in vector or matrix form.

In some embodiments, determining the localized acoustic response of the room 201*b* involves accounting for a self-response of the playback device 210*b* or of a microphone of the playback device 210*b*, for example, by processing the captured audio data representing reflections of the audio content in the room 201*b* so that the captured audio data reduces or excludes the playback device's native influence on the audio reflections.

In one example, the self-response of the playback device 210*b* is determined in an anechoic chamber, or is otherwise known based on a self-response of a similar playback device being determined in an anechoic chamber. In the anechoic chamber, audio content output by the playback device 210*b* is inhibited from reflecting back toward the playback device 210*b*, so that audio captured by a microphone of the playback device 210*b* is indicative of the self-response of the playback device 210*b* or of the microphone of the playback device 210*b*. Knowing the self-response of the playback device 210*b* or of the microphone of the playback device 210*b*, the playback device 210*b* offsets such a self-response from the captured audio data representing reflections of the first audio content when determining the localized acoustic response of the room 201*b*.

Once the localized acoustic response of the room 201*b* is known, the playback device 210*b* accesses the database 250*a* to determine a set of calibration settings to account for the acoustic response of the room 201*b*. More specifically, the playback device 210*b* determines a recorded and stored localized acoustic response recorded during a previous multi-location calibration which is within a threshold similarity (e.g., most similar to) the localized acoustic response of the room 201*b*. For example, the playback device 210*b* establishes a connection with the computing device 206 and with the database 250*a* of the computing device 206, and the playback device 210*b* queries the database 250*a* for a stored acoustic room response that corresponds to the determined localized acoustic response of the room 201*b*.

In some examples, querying the database 250*a* involves mapping the determined localized acoustic response of the room 201*b* to a particular stored acoustic room response in the database 250*a* that satisfies a threshold similarity to the localized acoustic response of the room 201*b*. This mapping may involve comparing values of the localized acoustic response to values of the stored localized acoustic room responses and determining which of the stored localized acoustic room responses are similar to the instant localized acoustic response. For example, in implementations where the acoustic responses are represented as vectors, the mapping may involve determining distances between the localized acoustic response vector and the stored acoustic response vectors. In such a scenario, the stored acoustic response vector having the smallest distance from the localized acoustic response vector of the room 201*b* may be identified as satisfying the threshold similarity. In some examples, one or more values of the localized acoustic response of the room 201*b* may be averaged and compared to corresponding averaged values of the stored acoustic responses of the database 250*a*. In such a scenario, the stored acoustic response having averaged values closest to the averaged values of the localized acoustic response vector of the room 201*b* may be identified as satisfying the threshold similarity. Other examples are possible as well.

As shown, the room 201*b* depicted in FIG. 2C and the room 201*a* depicted in FIG. 2A are similarly shaped and have similar layouts. Further, the playback device 210*b* and the playback device 210*a* are arranged in similar positions in their respective rooms. As such, when the localized room response determined by playback device 210*b* for room 201*b* is compared to the room responses stored in the database 250*a*, the computing device 206 may determine that the localized room response determined by playback device 210*a* for room 201*a* has at least a threshold similarity to the localized room response determined by playback device 210*b* for room 201*b*.

In some examples, querying the database 250*a* involves querying only a portion of the database 250*a*. For instance, as noted above, the database 250*a* may identify a type or configuration of playback device for which each record of the database 250*a* is generated. Playback devices of the same type or configuration may be more likely to have similar room responses and may be more likely to have compatible calibration settings. Accordingly, in some embodiments, when the playback device 210*b* queries the database 250*a* for comparing the localized acoustic response of the room 201*b* to the stored room responses of the database 250*a*, the playback device 210*b* might only compare the localized acoustic response of the room 201*b* to stored room responses associated with playback devices of the same type or configuration as the playback device 210*b*.

Once a stored acoustic room response of the database 250*a* is determined to be threshold similar to the localized acoustic response of the room 201*b*, then the playback device 210*b* identifies a set of calibration settings associated with the threshold similar stored acoustic room response. For instance, as shown in FIG. 2B, each stored acoustic room response is included as part of a record that also includes a set of calibration settings designed to account for the room response. As such, the playback device 210*b* retrieves, or otherwise obtains from the database 250*a*, the set of calibration settings that share a record with the threshold similar stored acoustic room response and applies the set of calibration settings to itself. Alternatively, the playback device 201*b* may determine (i.e. calculate) a set of calibration settings based on a target frequency curve and the threshold similar stored acoustic room response.

After applying the obtained calibration settings to itself, the playback device 210*b* outputs, via its one or more transducers, second audio content using the applied calibration settings. Even though the applied calibration settings were determined for a different playback device calibrated in a different room, the localized acoustic response of the room 201*b* is similar enough to the stored acoustic response that the second audio content is output in a manner that at least partially accounts for the acoustics of the room 201*b*. For instance, with the applied calibration settings, the second audio content output by the playback device 210*b* may have a frequency response, at one or more locations in the room 201*b*, that is closer to a target frequency response than the first audio content.

IV. Example Systems and Methods for Calibrating a Portable Playback Device

Figure 2D:
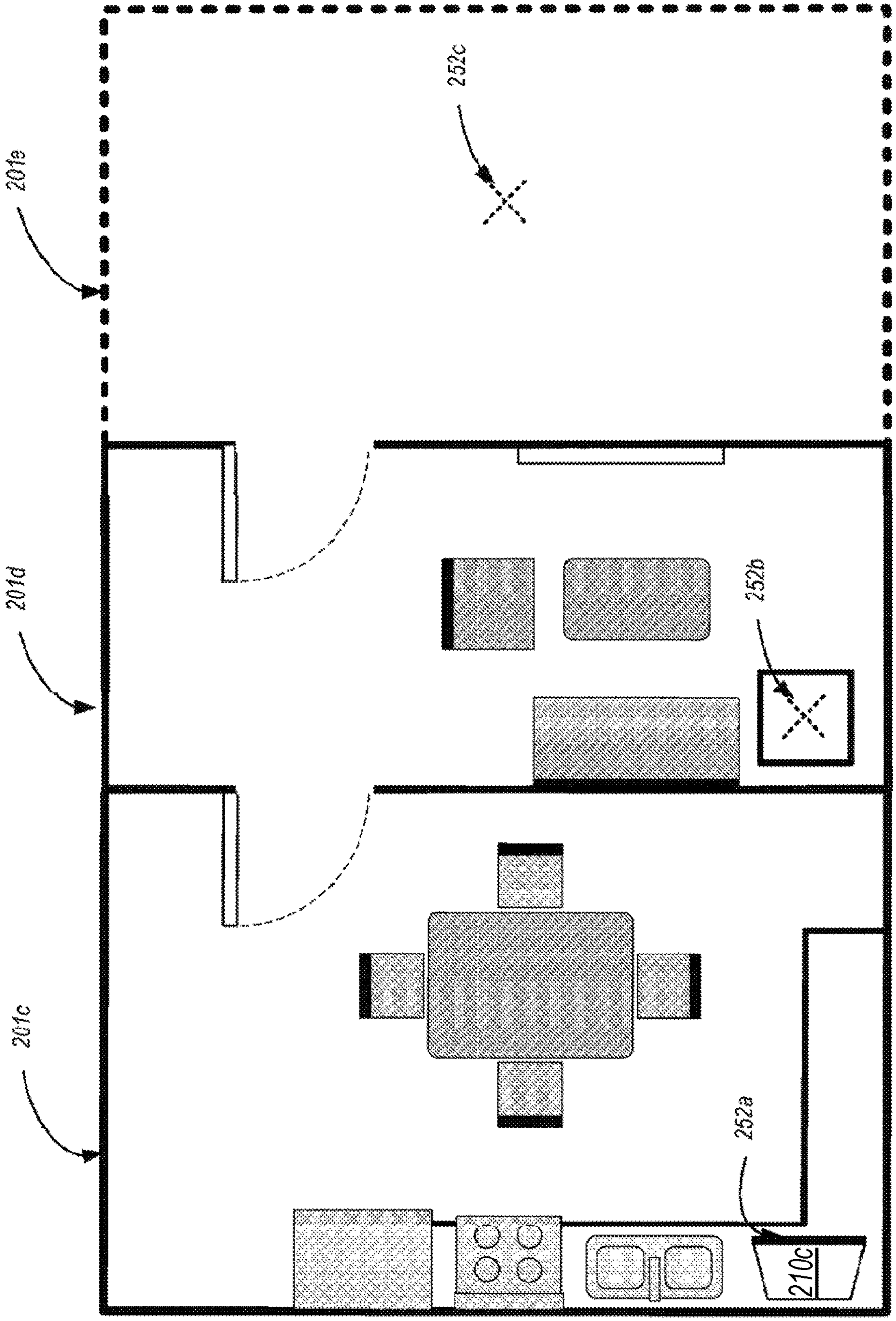
FIG. 2D is a diagram of playback environments within which a playback device may be calibrated.

FIG. 2D depicts example environments in which a portable playback device 210*c* performs playback device calibration upon changing conditions, such as movement to a new location or passage of time. The portable playback device 210*c* may be similar to any of the playback devices 110 depicted in FIGS. 1A-1E and 1G, and the network device 230 may be similar to any of the NMDs 120 or controllers 130 depicted in FIGS. 1A-1B and 1F-1H. In contrast with the playback devices 110, the portable playback device 210*c* may be configured for portable use. As such, the portable playback device 210*c* may include one or more batteries to power the portable playback device 210*c* while disconnected from wall power. Further, the components of the portable playback device 210*c* may be configured to facilitate portable use such as by implementing certain processors, amplifiers, and/or transducers to balance audio output levels and battery life. Yet further, a housing of the portable playback device 210*c* may be configured to facilitate portable use such as by including or incorporating a carrying handle or the like.

Figure 2E:
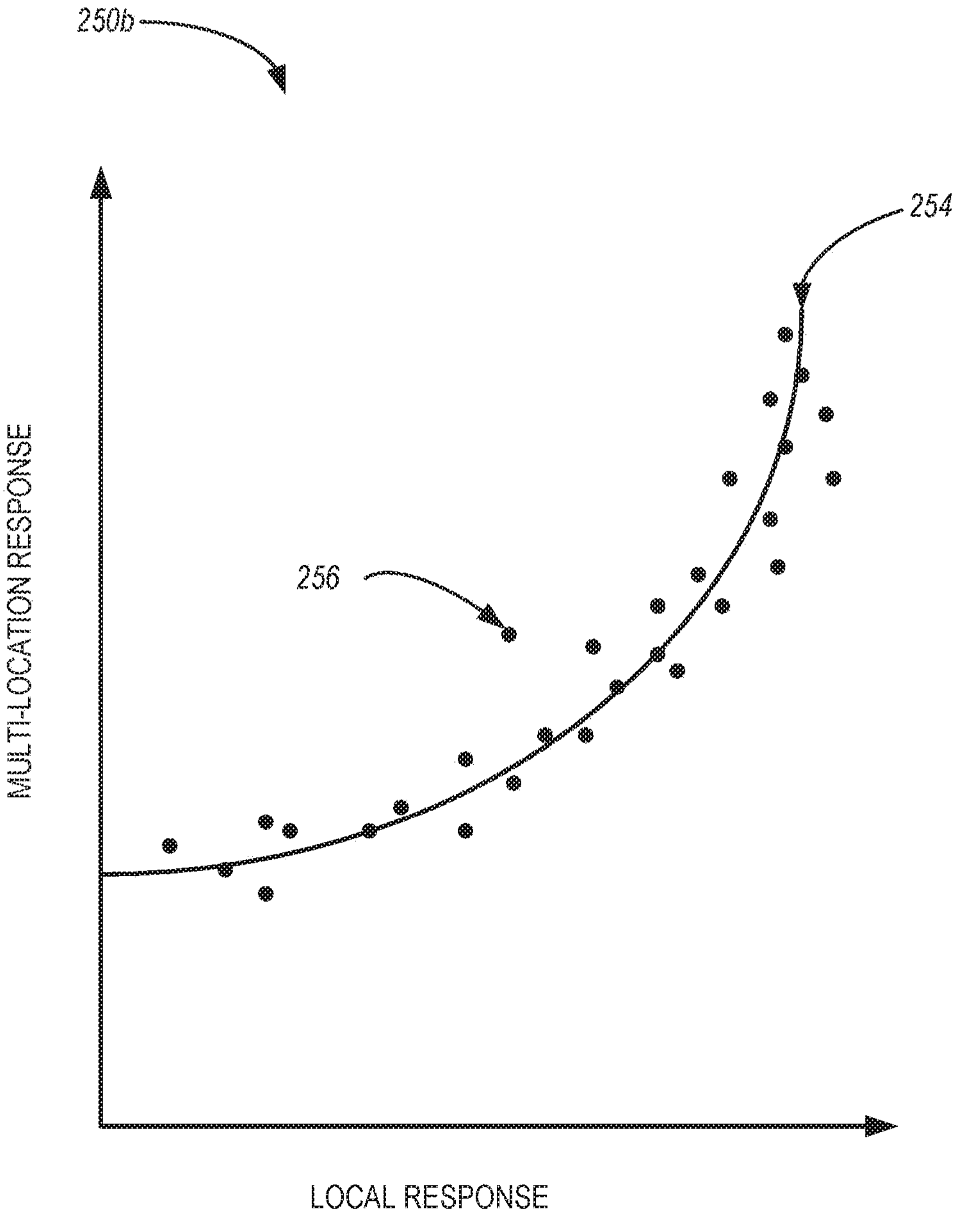
FIG. 2E is a graphical representation of a database for storing room response data and corresponding playback device calibration settings.

Given that the portable playback device 210*c* is configured for portable operation, during regular use, a user may be expected to relocate the portable playback device 210*c* relatively frequently. For example, at various times a user may move portable playback device 210*c* to locations 252*a*, 252*b*, and 252*c* in rooms 201*c*, 201*d*, and 201*e*, respectively. By way of example, room 201*c* may be a kitchen, room 201*d* may be a family room, and room 201*e* may be a patio or other outdoor area. Localized acoustic responses vary between rooms 201*c*, 201*d*, and 201*e* and self-calibration at each location is desirable. The portable playback device 210*c* might not consistently or reliably have access to database 250*a* and/or computing device 206, as the portable playback device 210*c* may be located out of Wi-Fi range or may disable its network interface(s) to lower battery use. As such, in some embodiments, the portable playback device 210*c* may include a locally stored database 250*b* (as shown in FIG. 2E) to perform self-calibration on the portable playback device 210*c* without accessing a remote database.

Additionally or alternatively, the playback device 210*c* may leverage both a remote database, such as database 250*a*, and a local database, such as database 250*b*, during various calibrations. More specifically, in some embodiments, the playback device 210*c* may access a remote database, such as database 250*a*, when said access is available. For example, the playback device 210*c* may perform calibration by accessing the remote database 250*a* when the playback device is within Wi-Fi range and by accessing the local database 250*b* when the playback device is outside of Wi-Fi range.

In some embodiments, portable playback devices may perform calibration using a multi-location acoustic response of a room by way of methods disclosed herein and incorporated by reference. In some embodiments, portable playback devices may leverage a database (e.g., 250*a* or 250*b*) used to perform self-calibration process without determining a multi-location acoustic response of its room by way of methods disclosed herein and incorporated by reference. Further, some portable playback devices may be configured to perform calibration by way of using a multi-location acoustic response of a room and self-calibration process without determining a multi-location acoustic response of its room. As such, a variety of calibration initiation techniques may be employed on portable playback devices to account for various device capabilities and environments.

A. Calibration Initiation

The portable playback device 210*c* calibration and/or self-calibration process may be initiated at various times and/or in various ways. In one example, calibration and/or self-calibration of the portable playback device 210*c* may be initiated when the portable playback device 210*c* is being set up for the first time, for example, in the room 201*c* and/or when the portable playback device 210*c* first outputs music or some other audio content, as described in any manner disclosed herein. In another example embodiment, the portable playback device 210*c* may initiate calibration and/or self-calibration when the power is turned on and/or audio content begins playing.

To account for the movement, and therefore changing conditions, of the portable playback device 210*c*, a variety of self-calibration initiation techniques may be employed. In some example embodiments, the playback device 210*c* initiates self-calibration based on movement to a new location. By way of example, a user may move the portable playback device 210*c* from room 201*c* to room 201*d*. The portable playback device 210*c* may initiate self-calibration once the portable playback device 210*c* is placed in the new location 252*b*. Similarly, the portable playback device 210*c* may stall or suspend any self-calibration upon indication of movement, as self-calibration while the portable playback device 210*c* is in transit is unnecessary and would result in an inaccurate acoustic room response.

In these examples, the portable playback device 210*c* may be configured to detect movement of the portable playback device 210*c* by way of, for example, one or more accelerometers, or other suitable motion detection devices (e.g., via a GPS or wireless signal strength variations). An accelerometer, or other motion detection device, is configured to collect and output data indicative of movement by the portable playback device 210*c*. The portable playback device 210*c* may determine whether to initiate self-calibration and/or suspend self-calibration based on movement data from the accelerometer. More specifically, the portable playback device 210*c* may suspend self-calibration upon receiving an indication from the accelerometer that the portable playback device 210*c* is in motion. Conversely, the portable playback device 210*c* may initiate self-calibration upon receiving an indication from the accelerometer that the portable playback device 210*c* is stationary for a predetermined duration of time (e.g., 5 seconds, 10 seconds). Further, the playback device 210*c* may not initiate calibration unless and/or until the playback device 210*c* is in use (i.e., outputting audio content).

In some example embodiments, self-calibration of the portable playback device 210*c* may only be initiated upon placement of the portable playback device 210*c* (i.e., self-calibration initiates when the portable playback device 210*c* is set down on a surface or playback device base (as described below)). In these examples, the portable playback device 210*c* does not initiate self-calibration until the portable playback device 210*c* has been moved and set down and is stationary.

In a different example scenario, a user may move the portable playback device 210*c* while in use (i.e., outputting audio content) but between self-calibration periods (i.e., the portable playback device 210*c* is not actively performing self-calibration). The portable playback device 210*c* may detect the motion by way of motion data from the accelerometer. In response to receiving the motion data, the portable playback device 210*c* may delay initiation of self-calibration until receiving data indicating the portable playback device 210*c* is stationary. Once the portable playback device 210*c* is stationary for a period of time (e.g., 2 seconds) the portable playback device 210*c* may initiate self-calibration and continue, for example, periodically thereafter.

Similarly, in another example scenario, a user may move the portable playback device 210*c* while in use and while the portable playback device 210*c* is performing self-calibration. In response to receiving data from the accelerometer indicating the portable playback device 210*c* is in motion, the portable playback device 210*c* may suspend calibration until the portable playback device 210*c* is stationary again. In some examples, the portable playback device 210*c* may initiate self-calibration once the portable playback device 210*c* is stationary for a period of time (e.g., 2 seconds). The portable playback device 210*c* may continue initiating self-calibration, for example, periodically thereafter. Similar methods may be utilized for other suitable motion detection devices, such as a GPS or gyroscope.

In some embodiments, while the portable playback device 210*c* is in motion, the most-recent determined audio calibration settings may be applied to the audio content. Alternatively, while the portable playback device 210*c* is in motion, standard audio calibration settings may be applied, such as a factory default setting. In another example, while the portable playback device 210*c* is in motion, the portable playback device 210*c* may apply stored set of audio calibration settings for use when the portable playback device 210*c* is in motion. Many other examples are possible. To avoid an abrupt change in audio calibration settings, such as when portable playback device 210*c* is picked up and factory default audio calibration settings are applied, audio calibration settings may be applied gradually (e.g., over a period of 5 seconds).

Further, in some embodiments, any calibration data stored on the portable playback device 210*c* or applied to the audio content may be erased from the portable playback device 210*c* once it is moved or picked up. By deleting calibration data, data storage and/or processing cycles may be freed up.

Additionally or alternatively, portable playback device 210*c* may be compatible with one or more playback device bases. A playback device base may include, for example, device charging systems, a base identifier (i.e., distinguishes that playback device base from other playback device bases), and a control system including one or more processors and a memory. Additional details regarding playback device bases may be found, for example, in U.S. Pat. No. 9,544,701, which was incorporated by reference above.

In some embodiments, a single playback device may be compatible with a number of playback device bases. Similarly, a playback device base may be compatible with a number of playback devices. By way of example, there may be a first, second, and third playback device base at locations 252*a*, 252*b*, and 252*c*, respectively. In this example, the portable playback device 210*c* may be compatible with all three playback device bases. In these examples, the portable playback device 210*c* may initiate calibration and/or self-calibration once the portable playback device 210*c* is placed on any of the playback device bases.

In some embodiments, the portable playback device 210*c*, the playback device base, and/or the computing device 206 may store the determined acoustic response once the portable playback device 210*c* has been calibrated at a particular base. For example, the portable playback device 210*c* may be placed on the playback device base at location 252*b* and initiate self-calibration. Once the self-calibration is complete, the portable playback device 210*c*, the playback device base, and/or the computing device 206 may store the determined audio calibration settings. More specifically, in some embodiments, the portable playback device 210*c* may store the determined acoustic response locally on the device with the corresponding playback device base identifier. This is desirable for future use, as the determined audio calibration settings can be readily retrieved and applied to the portable playback device 210*c* once the portable playback device 210*c* is placed on the playback device base at a later time. Similarly, the determined audio calibration settings may be transmitted to a remote computing device, such as computing device 206, to be retrieved at a later time.

Further, the determined acoustic response may be stored locally on the playback device base or remotely on the computing device 206 for other playback devices placed on the playback device base at a later time. For example, a playback device, other than portable playback device 210*c*, may be compatible with and placed on the playback device base at location 252*b*. The newly placed playback device may retrieve and apply stored audio calibration settings for example, from the playback device base or the remote computing device 206.

Additionally, in some examples, a playback device base may be compatible with more than one type or model of playback device. In these examples, the playback device base and/or remote computing device 206 may store calibration settings specific to the different types of playback devices. For example, a playback device base may be compatible with portable playback device 210*c* and a "SONOS ONE" playback device. The playback device base and/or computing device 206 may store audio calibration settings corresponding to the type of playback device, such that audio calibrations settings specific to the type of device may be readily retrieved and applied to the audio content (e.g., "SONOS ONE" playback device calibration settings are applied to any "SONOS ONE" playback devices placed on the playback device base at a particular location). In another example embodiment, the playback device base and/or remote computing device 206 may store acoustic responses which are independent of device type. For example, the playback device 210*c* may retrieve and apply audio calibration settings corresponding to an acoustic response previously determined by a different type of playback device and stored on the playback device base and/or remote computing device 206.

In some example embodiments, the playback device base excludes a playback device base identifier. In these examples, the playback device 210*c* may perform calibration and/or self-calibration upon placement on the playback device base to identify the particular playback device base. For example, the playback device 210*c* may identify that it has been placed on a playback device base and match the same or similar acoustic response with a determined acoustic response from a previously performed calibration and/or self-calibration stored on the playback device 210*c* and retrieve and apply the audio calibration settings selected in the previous calibration.

Receiving the same or similar response indicates that the playback device 210*c* may be on the same playback device base as when the matching or similar acoustic response was previously recorded. In some examples the playback device 210*c* may store the acoustic responses and determined audio calibration setting in association with the particular playback device. In some examples, the matching or similar previously determined acoustic response may have been determined using the multi-location calibration techniques, whereas the more recent acoustic response was determined without using the multi-location calibration techniques. In these examples, the playback device 210*c* may apply the audio settings corresponding to the determined multi-location acoustic response, as this room response may be more accurate.

Alternatively, in examples where the playback device 210*c* does not identify a matching acoustic response, the playback device 210*c* may initiate or continue calibration and/or self-calibration according to any of the calibration initiation techniques described herein.

In another example, calibration and/or self-calibration of the portable playback device 210*c* may be initiated via a controller device, such as the controller device 130*a* depicted in FIG. 1H. For instance, a user may access a controller interface for the portable playback device 210*c* to initiate calibration of the playback device 210*c*. In one case, the user may access the controller interface, and select the portable playback device 210*c* (or a group of playback devices that includes the portable playback device 210*c*) for calibration. In some cases, a calibration interface may be provided as part of a playback device controller interface to allow a user to initiate playback device calibration. Additionally, self-calibration may be initiated based on a user input indicating that the portable playback device 210*c* has moved to a new location (e.g., a change in playback zone name associated with the playback device 210*c*). Other examples are also possible.

In another example, calibration of the portable playback device 210*c* may be initiated by a user via voice input or a voice command. In these examples, the portable playback device 210*c* may be an NMD, such as NMD 120*a*. The user may say a command, such as "calibrate" or "start calibration". Upon receipt and processing of the command, the portable playback device 210*c* may initiate calibration. Many other calibration initiation processing commands are possible.

Similarly, in some embodiments, the portable playback device 210*c* may initiate self-calibration in response to receiving an instruction or command to play audio content. For example, a user may issue a command by way of, for example, a controller device 130*a* or voice command to play music on the portable playback device 210*c*. Once the music begins playing, portable playback device 210*c* may initiate self-calibration.

In some examples, a user may wish to deactivate automatic or repetitive (e.g., periodic, as described below) self-calibration. In these examples, the user may deactivate or stall calibration by way of a controller device 130*a* or a voice command, as described above. For example, the user may toggle an automatic calibration function on or off by way of a user interface on the controller device 130*a*. This may be desirable to save battery power, as, in some implementations, the calibration is computationally intensive and involves significant battery usage. This may also be desirable to accommodate user preference. Self-calibration relies on enablement of one or more microphones on the portable playback device 210*c*, which may also be utilized for voice-commands, as described above. As such, the user may toggle off the automatic calibration of the portable playback device 210*c* due to a preference to keep the one or more microphones disabled.

Further, in some examples, self-calibration of the playback device 210*b* is initiated periodically, or after a threshold amount of time has elapsed after a previous calibration, in order to account for changes to the environment or changes in the location of the playback device 210*c*.

In some embodiments, the portable playback device 210*c* may initiate self-calibration periodically while the portable playback device 210*c* is in use (i.e., outputting audio content). For example, the time period between self-calibration cycles may be between 10 seconds and 30 seconds. In other examples, the portable playback device 210*c* may initiate self-calibration every 30 minutes. Many other examples are possible.

In some examples, the portable playback device 210*c* is playing audio content when the predetermined duration of time has passed. Because playing audio content is necessary for self-calibration, the portable playback device 210*c* may stall or suspend the calibration initiation until the portable playback device 210*c* begins outputting audio content (e.g., when a user issues a command to play music on the portable playback device 210*c*, as described above). Further, as described above, calibration may continue over a period of time until enough acoustic response data is recorded and collected. In some examples, the period between calibrations is measured from the time calibration is completed. In other examples, the period between calibrations is measured from the initiation of the calibration.

Receiving the same or similar acoustic response data indicates that the portable playback device 210*c* has not moved since a previous self-calibration and therefore does not require further calibration until the portable playback device 210*c* is relocated. As such, in some embodiments, periodic self-calibration initiation may slow (i.e., the time periods between self-calibration increase) or stop if the acoustic response data is the same or similar over a period of time.

For example, the portable playback device 210*c* may be in use (i.e., outputting audio content) in location 252*a* for an extended period without relocation. In this example, the portable playback device 210*c* may periodically initiate self-calibration every 20 seconds. After receiving the same or similar acoustic response a number of times (e.g., 15 times), the portable playback device may increase the self-calibration initiation period to, for example, 40 seconds. The portable playback device 210*c* may continue to increase the self-calibration initiation period upon repeatedly receiving the same or similar acoustic responses (e.g., 60 seconds, 80 seconds, etc.). In some embodiments, the portable playback device 210*c* may even suspend self-calibration initiation until receiving some other prompt to perform calibration and/or self-calibration (e.g., receiving data indicating motion of the portable playback device 210*c*, user instruction, etc.). This may be desirable to save battery power, as the self-calibration process is computationally intensive and involves a significant battery usage.

In some embodiments, periodic self-calibration initiation may be used in combination with other calibration and/or self-calibration initiation techniques, such as motion data based and/or playback device base calibration initiation. For example, the portable playback device 210*c* may periodically initiate self-calibration. In one example scenario, a user may move the portable playback device 210*c* while in use (i.e., outputting audio content) but between self-calibration periods. The portable playback device 210*c* may detect the motion by way of motion data from the accelerometer. In response to receiving the motion data, the portable playback device 210*c* may not initiate self-calibration until receiving data indicating the portable playback device 210*c* is stationary. Once the portable playback device 210*c* is stationary for a period of time (e.g., 10 seconds) the portable playback device 210*c* may initiate self-calibration and continue thereafter periodically.

Similarly, in another example scenario, a user may move the portable playback device 210*c* while in use and while the portable playback device is performing calibration and/or self-calibration. In response to receiving data from the accelerometer indicating the portable playback device 210*c* is in motion, the portable playback device may suspend self-calibration until the portable playback device is stationary again. Once the portable playback device 210*c* is stationary for a period of time (e.g., 10 seconds) the portable playback device 210*c* may initiate self-calibration and continue thereafter periodically. Additionally or alternatively, the playback device 210*c* may delete or discard the data collected via the microphone before the playback device 210*c* began moving (i.e., the data from the interrupted/suspended calibration).

Additionally or alternatively, in some embodiments the portable playback device 210*c* initiates self-calibration periodically while being used in conjunction with a playback device base to account for changing conditions in the environment of the portable playback device 210*c*. In an example scenario, a user may remove the portable playback device 210*c* from the playback device base at location 252*a* while in use but between self-calibration periods. Once the portable playback device 210*c* is removed from the playback device base, the portable playback device 210*c* does not initiate self-calibration until receiving data indicating the portable playback device 210*c* is stationary or placed on another playback device base (e.g., playback device base at location 252*b*). Once the portable playback device 210*c* is stationary for a period of time (e.g., 10 seconds) and/or is placed at another playback device base (e.g., playback device base at location 252*b*), the portable playback device 210*c* may initiate calibration and continue thereafter periodically.

Similarly, in an example scenario, a user may remove the portable playback device 210*c* from the playback device base at location 252*a* while outputting audio content and while the portable playback device 210*c* is performing calibration. Once the portable playback device 210*c* is removed from the playback device base, the portable playback device 210*c*, may suspend self-calibration until the portable playback device is stationary again or placed on another playback device base (e.g., playback device base at location 252*b*). Once the portable playback device 210*c* is stationary for a period of time and/or is placed at another playback device base (e.g., playback device base at location 252*b*), the portable playback device 210*c* may initiate self-calibration and continue thereafter periodically.

These calibration and self-calibration initiation techniques may be used alone or in combination with any calibration techniques described herein.

B. Portable Playback Device Local Calibration and Local Calibration Database

As described above, in some embodiments, portable playback devices may perform calibration using a multi-location acoustic response of a room by way of methods disclosed herein. In some embodiments, portable playback devices may leverage a database (e.g., 250*a* or 250*b*) to perform self-calibration process without determining a multi-location acoustic response of its room by way of methods disclosed herein. Further, some portable playback devices may be configured to perform both calibration by way of using a multi-location acoustic response of a room and self-calibration process without determining a multi-location acoustic response of its room. Due to movement and relocation, portable playback device 210*c* might not consistently or reliably have access to database 250*a* and/or computing device 206. As such, in some embodiments, the portable playback device 210*c* may include a locally stored database 250*b* (as shown in FIG. 2E) to perform self-calibration on the portable playback device 210*c* without accessing a remote database.

FIG. 2E depicts an example representation of database 250*a* to be locally stored database 250*b* for portable playback device 210*c*. To account for the storage and computational capabilities of an individual portable playback device 210*c*, the locally stored database 250*b* may be a representation or generalization of the database 250*a* stored on a remote computing device 206.

As described above, the database 250*a* leveraged during some self-calibration is based on historical calibration settings 256 previously collected on other playback devices in which a particular playback device was calibrated by determining calibration settings based on a multi-location acoustic response. In some examples, the database 250*a* includes historical calibration settings collected on many types of playback devices. In another example the database 250*a* includes historical calibration settings collected specifically on a number of portable playback devices. These historical calibration settings for portable playback devices may be developed through concurrent multi-location acoustic responses and localized acoustic responses, as described above.

In some example embodiments, the locally stored database 250*b* may include historical data points 256, or a representation thereof, from the entirety or a majority of database 250*a*. In other example embodiments, the locally stored database 250*b* may include historical data points 256, or a representation thereof, from calibration settings collected on portable playback devices. Alternatively, in some example embodiments, the locally stored database 250*b* may include historical data points 256, or a representation thereof, from calibration settings collected on a limited number of types of playback devices which are similar in some way to portable playback devices. Many examples are possible.

In some example embodiments, the locally stored database 250*b* is a generalization of database 250*a*. One example of such a generalization or representation is a best fit line 254 of a frequency response. In these examples, the portable playback device 210*c* may locally store the generalization (i.e., best fit line 254) data. Another example of a generalization or representation is a best fit line 254 of historical local responses corresponding to historical multi-location responses. While FIG. 2E illustrates a best fit line 254 along two axes, a best fit line 254 may be representative of a number of inputs in multi-dimensional space. This is desirable as a best fit line 254 requires much less memory and self-calibration may be much less computationally intensive. In these examples, the locally stored database 250*b* may only include the best fit line(s) 254 rather than the individual historical data points 256. While FIG. 2E illustrates a single best fit line 254, locally stored database 250*b* may include a number of best fit lines 254. Other examples of representations and generalizations are possible as well. Further, the portable playback device 210*c* software updates may include updating database 250*b* to include updated data, as more multi-location calibration settings and localized acoustic responses are added to database 250*a*, as described above.

Self-calibration of portable playback devices may be similar to the methods of self-calibration of stationary playbacks described, herein. During self-calibration of a portable playback device 210*c*, however, the portable playback device may leverage the locally stored database 250*b*, rather than database 250*a*.

For example, when performing the self-calibration process, the portable playback device 210*c* outputs audio content and determines a localized acoustic response of its room 201*c* similarly to how playback devices 210*a* and 210*b* determined a localized acoustic response of rooms 201*a* and 201*b*, respectively. For instance, the portable playback device 210*c* outputs audio content, which may include music or one or more predefined tones, captures audio data representing reflections of the audio content within the room 201*c*, and determines the localized acoustic response based on the captured audio data.

As described above, in examples where the portable playback device 210*c* outputs music, the portable playback device 210*c* may continue to capture audio data representing reflections of the output music within the room 201*c* until a threshold amount of data at a threshold amount of frequencies is captured. Depending on the spectral content of the output music, the portable playback device 210*c* may capture the reflected audio data over the course of multiple songs, for instance, in order for the portable playback device 210*c* to have captured the threshold amount of data at the threshold amount of frequencies. In this manner, the portable playback device 210*c* learns the localized acoustic response of the room 201*c*, and once a threshold confidence in understanding of the localized acoustic response of the room 201*c* is met, then the playback device 210*c* uses the localized acoustic response of the room 201*c* to determine calibration settings for the portable playback device 210*c* utilizing the locally stored database 250*b*, as described in further detail below.

While outputting the audio content, the portable playback device 210*c* uses one or more stationary microphones, which may be disposed in or on a housing of the portable playback device 210*c* or may be co-located in or on an NMD proximate to the portable playback device 210*c*, to capture audio data representing reflections of the audio content in the room 201*c*. The playback device 210*c* then uses the captured audio data to determine the localized acoustic response of the room 201*c*. As described above, the localized acoustic response may include a spectral response, spatial response, or temporal response, among others, and the localized acoustic response may be represented in vector or matrix form.

In some embodiments, determining the localized acoustic response of the room 201*c* involves accounting for a self-response of the portable playback device 210*c* or of a microphone of the portable playback device 210*c*, for example, by processing the captured audio data representing reflections of the audio content in the room 201*c* so that the captured audio data reduces or excludes the playback device's native influence on the audio reflections.

In one example, the self-response of the portable playback device 210*c* is determined in an anechoic chamber, or is otherwise known based on a self-response of a similar portable playback device being determined in an anechoic chamber. In the anechoic chamber, audio content output by the portable playback device 210*c* is inhibited from reflecting back toward the portable playback device 210*c*, so that audio captured by a microphone of the portable playback device 210*c* is indicative of the self-response of the portable playback device 210*c* or of the microphone of the portable playback device 210*c*. Knowing the self-response of the portable playback device 210*c* or of the microphone of the portable playback device 210*c*, the portable playback device 210*c* offsets such a self-response from the captured audio data representing reflections of the first audio content when determining the localized acoustic response of the room 201*c*.

Further, in some example scenarios, the portable playback device 210*c* may be in a very noisy environment, such as a social event or outdoors. As such, in some examples, the audio processing algorithm may include a noise classifier to filter out noise when performing calibration or self-calibration. The noise classifier may be applied by the playback device 210*c* (e.g., via audio processing components 112*g*). Additionally or alternatively, the portable playback device 210*c* may apply a beam forming algorithm, such as a multichannel Weiner filter, to eliminate certain environmental noises (e.g., conversations in the foreground) when calibrating and/or self-calibrating the portable playback device 210*c*.

Once the localized acoustic response of the room 201*c* is known, the portable playback device 210*c* accesses the locally stored database 250*b* to determine a set of calibration settings to account for the acoustic response of the room 201*c*. For example, the portable playback device 210*c* queries the locally stored database 250*b* for a stored best fit line 254 room response that corresponds to the determined localized acoustic response of the room 201*c*.

In some examples, querying the locally stored database 250*b* involves mapping the determined localized acoustic response of the room 201*c* to a particular stored acoustic room response in the database locally stored database 250*b* that satisfies a threshold similarity to the localized acoustic response of the room 201*c*. More specifically, in some example embodiments, the playback device 210*c* determines a recorded and stored localized acoustic response from a previous multi-location calibration which is within a threshold similarity (e.g., most similar to) the localized acoustic response of the room 201*b*. This mapping may involve comparing values of the localized acoustic response to values of the stored acoustic room responses, or representations thereof according to the best fit line(s) 254, and determining which of the stored acoustic room responses are similar to the localized acoustic response. In some embodiments, the most similar stored acoustic room response is selected. Other examples are possible as well.

Once a stored acoustic room response of the locally stored database 250*b* is selected to be threshold similar to the localized acoustic response of the room 201*c*, then the portable playback device 210*c* identifies a set of calibration settings associated with the threshold similar stored acoustic room response. For instance, as shown in FIG. 2E, the best fit line 254 associates room responses and audio calibration settings. As such, the portable playback device 210*c* retrieves, or otherwise obtains from the locally stored database 250*b*, the set of calibration settings associated with the similar stored acoustic room response and applies the set of calibration settings to itself.

Portable playback device 210*c* may repeat this self-calibration process, or any other calibration process described herein, in any room or area (e.g., 201*d* and/or 20*e*) it is moved to according to any of the calibration initiation techniques described herein.

V. Example Methods

Figure 3:
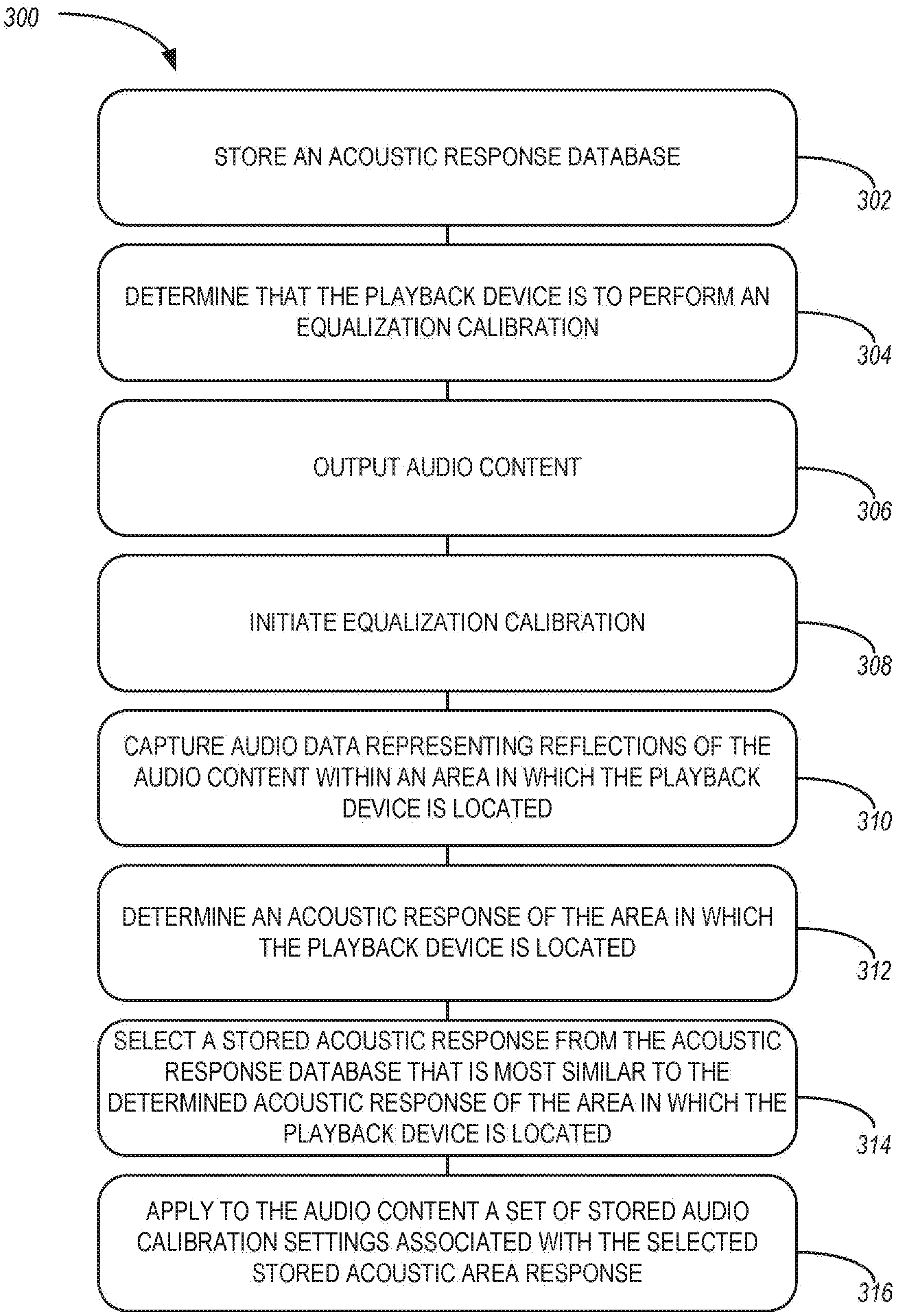
FIG. 3 is a flowchart of a method to calibrate a portable playback device.

FIG. 3 shows an example embodiment of a method 300 for establishing a database of calibration settings for playback devices. Method 300 can be implemented by any of the playback devices disclosed and/or described herein, or any other playback device now known or later developed.

Various embodiments of method 300 include one or more operations, functions, and actions illustrated by blocks 302 through 316. Although the blocks are illustrated in sequential order, these blocks may also be performed in parallel, and/or in a different order than the order disclosed and described herein. Also, the various blocks may be combined into fewer blocks, divided into additional blocks, and/or removed based upon a desired implementation.

In addition, for the method 300 and for other processes and methods disclosed herein, the flowcharts show functionality and operation of one possible implementation of some embodiments. In this regard, each block may represent a module, a segment, or a portion of program code, which includes one or more instructions executable by one or more processors for implementing specific logical functions or steps in the process. The program code may be stored on any type of computer readable medium, for example, such as a storage device including a disk or hard drive. The computer readable medium may include non-transitory computer readable media, for example, such as tangible, non-transitory computer-readable media that stores data for short periods of time like register memory, processor cache, and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the methods 300 and 320 and for other processes and methods disclosed herein, each block in FIG. 3 may represent circuitry that is wired to perform the specific logical functions in the process.

Method 300 involves calibrating a portable playback device by way of a locally stored acoustic response database.

Method 300 begins at a block 302, which involves storing, via a playback device, an acoustic response database comprising a plurality of sets of stored audio calibration settings. Each set of stored audio calibration settings is associated with a respective stored acoustic area response of a plurality of stored acoustic area responses. Example acoustic response databases include the database 250*a* (FIG. 2B) and the database 250*b* (FIG. 2E).

At the block 304, the method 300 involves determining that the playback device is to perform an equalization calibration of the playback device. In some embodiments, the block 304 may further involve, receiving from the accelerometer, data indicating the playback device is stationary for a predetermined duration of time. In response to detecting that the playback device is stationary for the predetermined duration of time, the playback device initiates the equalization calibration of the playback device.

In some embodiments, the block 304 may additionally involve performing the equalization calibration periodically over a first time period. Further, the playback device may receive, from the accelerometer, data indicating the playback device is stationary for a predetermined duration of time. In response to detecting that the playback device is stationary over the predetermined duration of time, the playback device performs the equalization calibration periodically over a second time period. The second time period is longer than the first time period.

In some embodiments, the block 304 may additionally involve receiving an instruction to play audio content. In response to the instruction to play audio content, the playback device plays the audio content and initiates the equalization calibration of the playback device.

In some embodiments, the block 304 may additionally involve excluding captured audio data representing noise in the area in which the playback device is located.

At block 306, method 300 involves outputting, via the speaker, audio content.

At block 308, the method 300 involves initiating the equalization calibration. In some embodiments, block 308 may additionally involve performing the equalization calibration periodically, wherein a time period between the equalization calibration is between 10 seconds and 30 seconds.

At block 310, method 300 involves capturing, via the microphone, audio data representing reflections of the audio content within an area in which the playback device is located.

At block 312, method 300 involves determining, via the playback device, an acoustic response of the area in which the playback device is located based on at least the captured audio data.

At block 314, method 300 involves selecting, via the playback device, a stored acoustic response from the acoustic response database that is most similar to the determined acoustic response of the area in which the playback device is located.

At block 316, method 300 involves applying to the audio content, via the playback device, a set of stored audio calibration settings associated with the selected stored acoustic area response.

In some embodiments, method 300 further involves receiving, from the accelerometer, data indicating motion of the playback device. In response to receiving data indicating motion of the playback device, the playback device suspends the equalization calibration of the playback device.

VI. Additional Examples

Figure 4A:
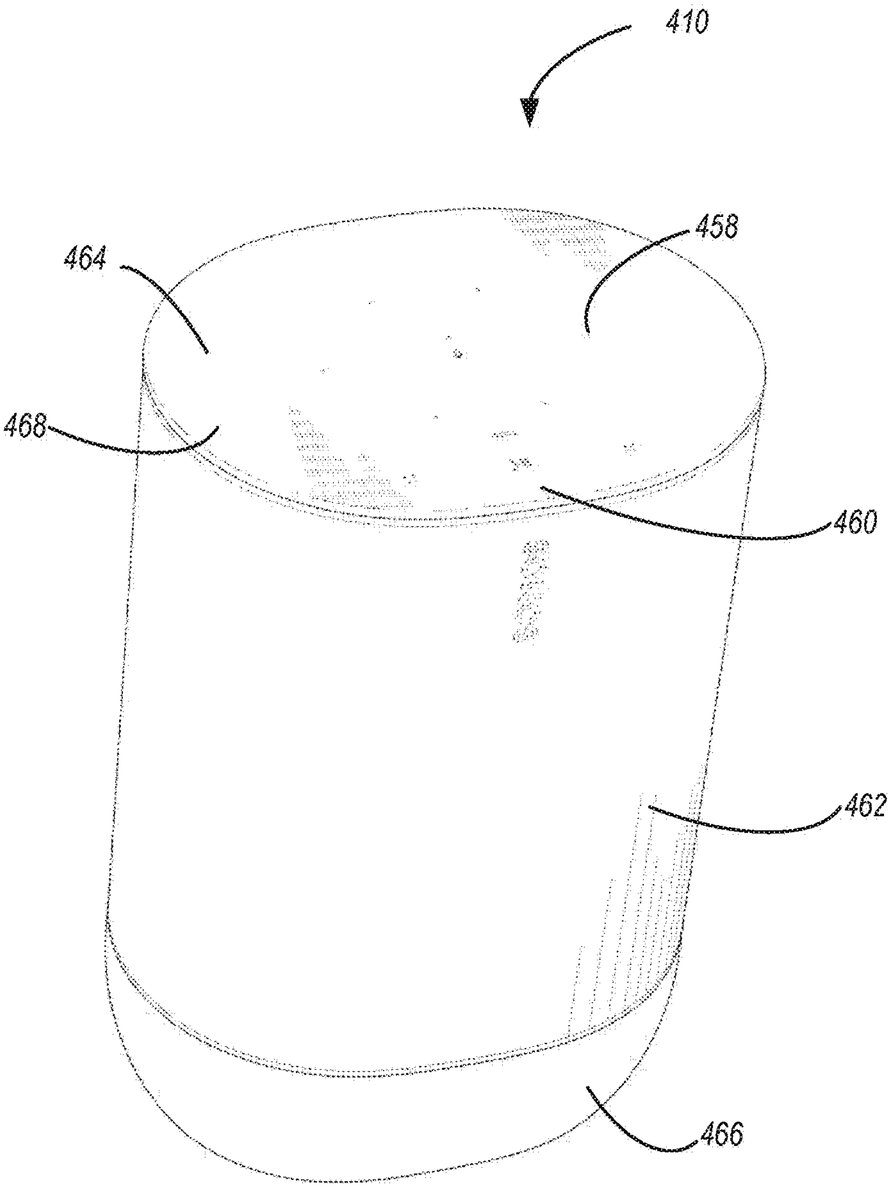
FIG. 4A is a first isometric view of a first example portable playback device.

FIG. 4A is a first isometric view of an example portable playback device 410. As shown in FIG. 4A, the portable playback device 410 includes a housing 464 comprising an upper portion 468, a lower portion 466 and an intermediate portion 462 (e.g., a grille). The grille of the intermediate portion 462 allows sound to pass through from the one or more transducers positioned within the housing 464.

A plurality of ports, holes or apertures 458 in the upper portion 468 allow sound to pass through to one or more microphones positioned within the housing 464. These microphones may be utilized in the example calibration techniques disclosed herein.

The upper portion 468 further includes a user interface 460. The user interface 460 includes a plurality of control surfaces (e.g., buttons, knobs, capacitive surfaces) including playback and activation controls (e.g., a previous control, a next control, a play and/or pause control). The user interface 460 is configured to receive touch input corresponding to activation and deactivation of the one or microphones.

Figure 4B:
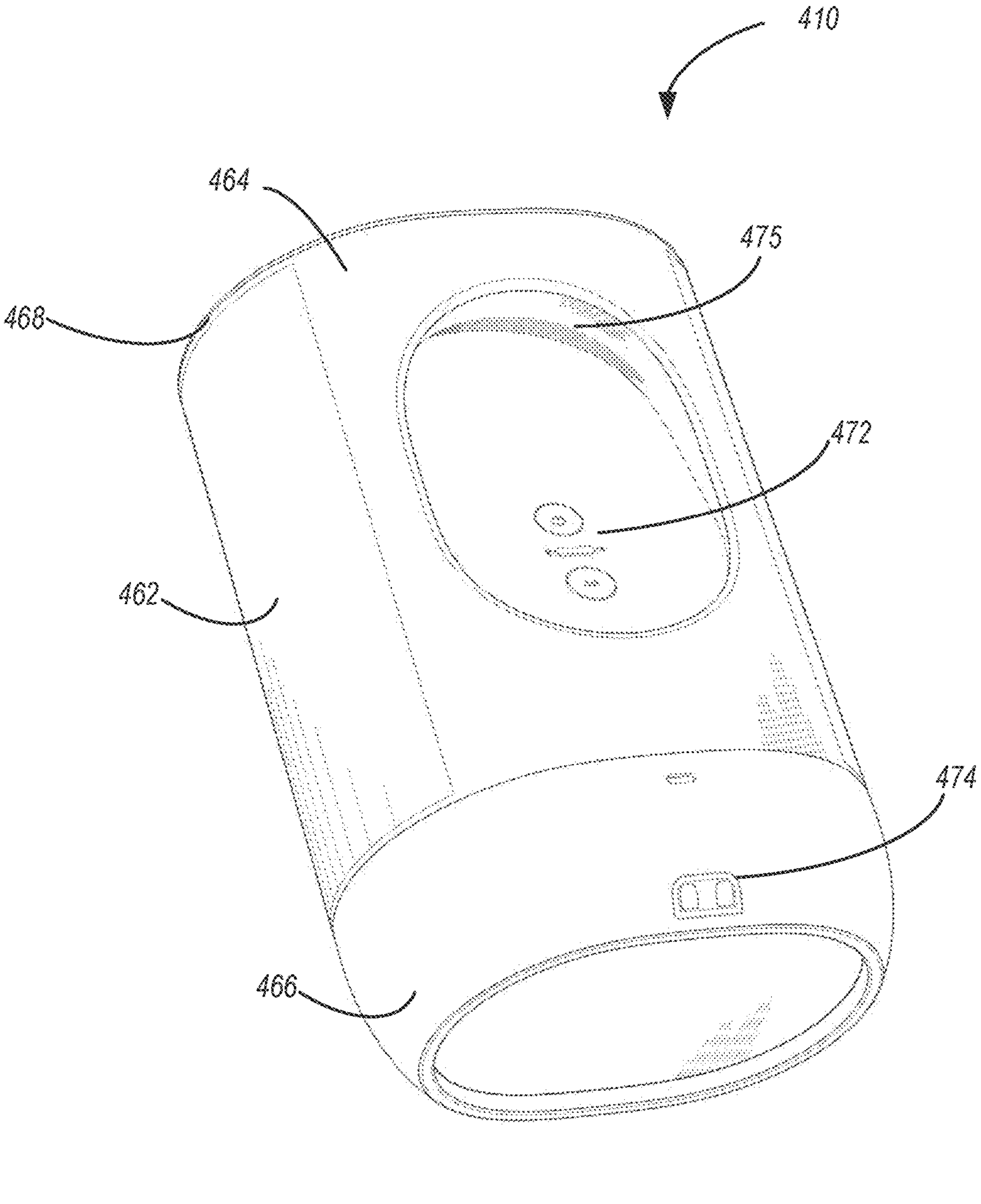
FIG. 4B is a second isometric view of the first example portable playback device.

FIG. 4B is a second isometric view of the portable playback device 410. As shown in FIG. 4B, the intermediate portion 462 further includes a user interface 472. The user interface 472 includes a plurality of control surfaces (e.g., buttons, knobs, capacitive surfaces) including playback, activation controls (e.g., a power toggle button, a Bluetooth device discovery control, etc.), and a carrying handle 475. The lower portion 466 also includes a power receptacle 474, as shown.

Figure 5:
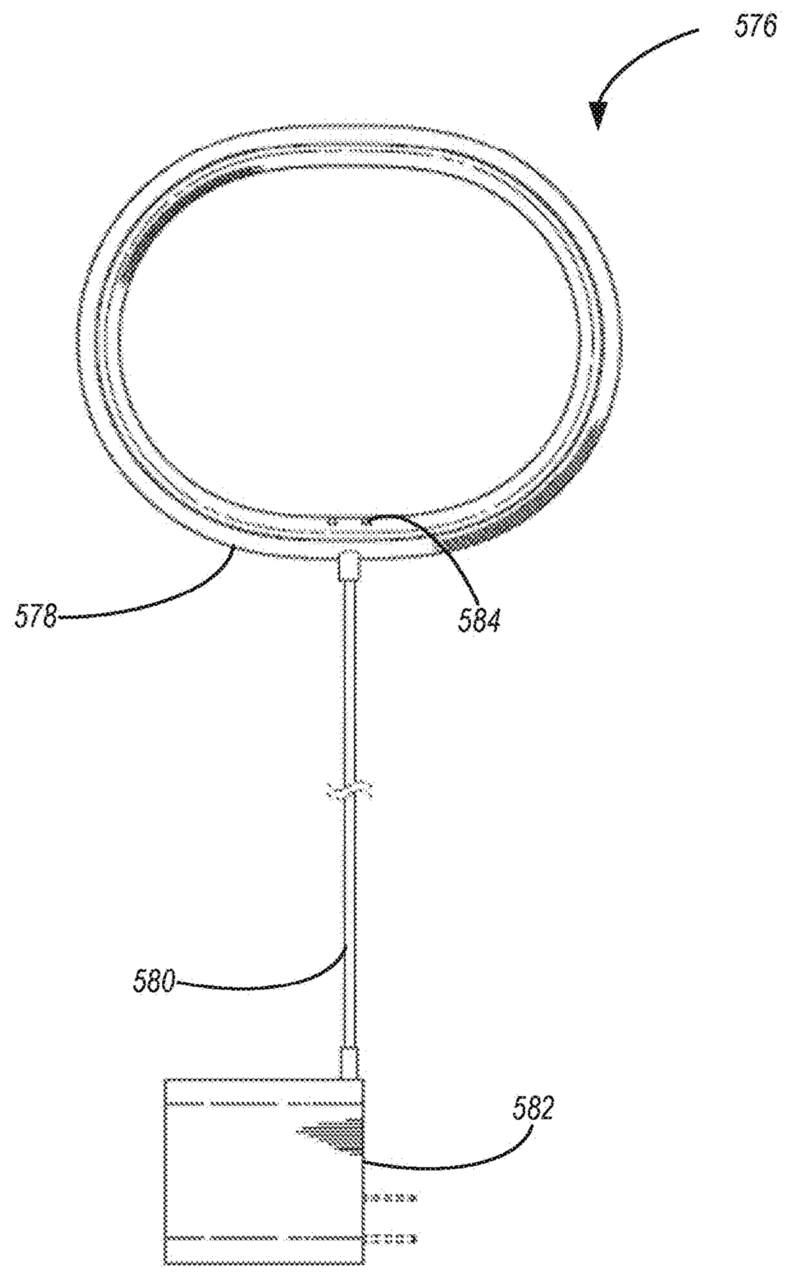
FIG. 5 is a top view of a playback device base to be used in conjunction with a portable playback device, such as the example portable playback device.

FIG. 5 is a top view of a playback device base 576 to be used in conjunction with a portable playback device, such as playback device 410. As shown in FIG. 5, the playback device base 576 includes a device receptacle 578, a power cord 580, and a power plug 582.

The device receptacle 578 is configured to receive playback device 410. The device receptacle 578 further includes a connection port 584 compatible with the playback device 410. As shown in FIG. 5, in some embodiments, the receptacle 578 may be a loop. Many other examples are possible.

In some embodiments, the power cord 580 is compatible with an electrical outlet. In other embodiments, the power cord 580 may be compatible with a USB port. In another embodiment, the power cord 580 may be compatible with both an electrical outlet and a USB port by way of detachable pieces, for example.

As described above, when on the playback device base 576, the portable playback device 410 may initiate calibration. When removed from the playback device base 576, the portable playback device 410 may suspend calibration until the portable device 410 is stationary again. Further, when on the playback device base 576, the portable playback device base 576 may provide power (i.e., battery recharging) to portable playback device 410.

VII. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The present technology is illustrated, for example, according to various aspects described below. Various examples of aspects of the present technology are described as numbered examples (1, 2, 3, etc.) for convenience. These are provided as examples and do not limit the present technology. It is noted that any of the dependent examples may be combined in any combination, and placed into a respective independent example. The other examples can be presented in a similar manner.

Example 1: A method comprising: storing an acoustic response database comprising a plurality of sets of stored audio calibration settings, each set of stored audio calibration settings associated with a respective stored acoustic area response of a plurality of stored acoustic area responses; determining that the playback device is to perform an equalization calibration of the playback device; and in response to the determination that the playback device is to perform the equalization calibration, initiating the equalization calibration, wherein the equalization calibration comprises: outputting, via the speaker, audio content; capturing, via the microphone, audio data representing reflections of the audio content within an area in which the playback device is located; based on at least the captured audio data, determining an acoustic response of the area in which the playback device is located; selecting a stored acoustic response from the acoustic response database that is most similar to the determined acoustic response of the area in which the playback device is located; and applying to the audio content, a set of stored audio calibration settings associated with the selected stored acoustic response.

Example 2: The method of example 1, further comprising receiving, from the accelerometer, data indicating motion of the playback device; and in response to receiving data indicating motion of the playback device, suspending the equalization calibration of the playback device.

Example 3: The method of any of examples 1-2, wherein determining that the playback device is to perform the equalization calibration of the playback device further comprises: receiving, from the accelerometer, data indicating the playback device is stationary for a predetermined duration of time; and in response to detecting that the playback device is stationary for the predetermined duration of time, initiating the equalization calibration of the playback device.

Example 4: The method of any of examples 1-3, wherein determining that the playback device is to perform the equalization calibration of the playback device comprises: performing the equalization calibration periodically over a first time period; receiving, from the accelerometer, data indicating the playback device is stationary for a predetermined duration of time; and in response to detecting that the playback device is stationary over the predetermined duration of time, performing the equalization calibration periodically over a second time period, wherein the second time period is longer than the first time period.

Example 5: The method of any of examples 1-4, wherein initiating the equalization calibration comprises performing the equalization calibration periodically, wherein a time period between the equalization calibration is between 10 seconds and 30 seconds.

Example 6: The method of any of examples 1-5, wherein determining that the playback device is to perform the equalization calibration of the playback device further comprises: receiving an instruction to play audio content; and in response to the instruction to play audio content, playing the audio content and initiating the equalization calibration of the playback device.

Example 7: The method of any of examples 1-6, wherein initiating the equalization calibration comprises performing the equalization calibration periodically according to a time period between the equalization calibrations, and wherein determining that the playback device is to perform the equalization calibration of the playback device further comprises: determining the playback device is not outputting audio content when the time period between equalization calibration has elapsed; and in response determining the playback device is not outputting audio content, suspending the equalization calibration of the playback device.

Example 8: The method of any of examples 1-7, wherein determining the acoustic response of the area in which the playback device is located further comprises: excluding captured audio data representing noise in the area in which the playback device is located.

Example 9: The method of any examples 1-8, wherein the plurality of stored acoustic area responses corresponds to a plurality of best fit lines of acoustic responses previously measured on multiple media playback systems.

Example 10: The method of any of examples 1-9, wherein each respective set of stored audio calibration settings includes respective audio calibration settings for offsetting one or more audio characteristics of an associated respective stored acoustic area response.

Example 11: A playback device configured to perform the method of any of examples 1-10.

Example 12: A tangible, non-transitory computer-readable medium having stored therein instructions executable by one or more processors to cause a device to perform the method of any of features 1-10.

Example 13: A system configured to perform the method of any of features 1-10.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A playback device comprising:
- a user interface comprising a power toggle control;
- a network interface;
- audio transducers;
- a microphone;
- at least one processor;
- a housing carrying the user interface, audio transducers, the microphone, and the at least one processor; and
- at least one non-transitory computer-readable medium comprising program instructions that are executable by the at least one processor such that the playback device is configured to:
  - initiate a self-calibration each time (1) power to the playback device is turned on and (2) the playback device begins playing the audio via the audio transducers;
  - perform the self-calibration initiated when (1) power to the playback device was turned on and (2) the playback device began playing the audio via the audio transducers, wherein the program instructions that are executable by the at least one processor such that the playback device is configured to perform the self-calibration comprise program instructions that are executable by the at least one processor such that the playback device is configured to:
    - while playing the audio via the audio transducers, capture via the microphone, microphone data representing environmental acoustic characteristics;
    - based on the captured microphone data, determine a calibration that at least partially offsets the environmental acoustic characteristics; and
    - apply the determined calibration; and
  - play back additional audio via the audio transducers while the determined calibration is applied.

2. The playback device of claim 1, wherein the audio comprises a playlist, and wherein the at least one non-transitory computer-readable medium further comprises program instructions that are executable by the at least one processor such that the playback device is configured to:
- receive, via the network interface from a mobile device, a command to play the playlist; and
- begin playing the audio via the audio transducers when the command is received.

3. The playback device of claim 1, wherein the audio comprises a Bluetooth audio stream, and wherein the network interface comprises a Bluetooth interface, and wherein the at least one non-transitory computer-readable medium further comprises program instructions that are executable by the at least one processor such that the playback device is configured to:
- receive, via the Bluetooth interface, the Bluetooth audio stream; and
- begin playing the audio via the audio transducers when the Bluetooth audio stream is received.

4. The playback device of claim 1, wherein the user interface further comprises a play/pause toggle control, and wherein the at least one non-transitory computer-readable medium further comprises program instructions that are executable by the at least one processor such that the playback device is configured to:
- detect selection of the play/pause toggle control; and
- begin playing the audio via the audio transducers when selection of the play/pause toggle control is detected.

5. The playback device of claim 1, further comprising an analog audio line-in interface, and wherein the at least one non-transitory computer-readable medium further comprises program instructions that are executable by the at least one processor such that the playback device is configured to:
- begin playing the audio via the audio transducers when an analog audio signal is provided via the analog audio line-in interface.

6. The playback device of claim 1, further comprising a network microphone device, wherein the at least one non-transitory computer-readable medium further comprises program instructions that are executable by the at least one processor such that the playback device is configured to:
- receive, via the microphone, voice data comprising a voice input; and send, via the network interface to a cloud-based voice assistant, at least a portion of the voice data for processing of the voice input.

7. The playback device of claim 6, wherein the at least one non-transitory computer-readable medium further comprises program instructions that are executable by the at least one processor such that the playback device is configured to:

receive, via the network interface from the cloud-based voice assistant, a playback command corresponding to the voice input; and begin playing the audio via the audio transducers according to the playback command corresponding to the voice input.

8. The playback device of claim 1, wherein the at least one non-transitory computer-readable medium further comprises program instructions that are executable by the at least one processor such that the playback device is configured to:

power on when the power toggle control is selected when powered off, and power off when the power toggle control is selected when powered on.

9. The playback device of claim 8, wherein the power toggle control comprises a touch-sensitive power toggle button.

10. The playback device of claim 1, further comprising at least one battery, wherein the housing carries the at least one battery, and wherein the playback device is configured to draw current from the at least one battery when disconnected from wall power.

11. The playback device of claim 10, wherein the at least one non-transitory computer-readable medium further comprises program instructions that are executable by the at least one processor such that the playback device is configured to:

disable initiation of self-calibration each time (1) power to the playback device is turned on and (2) the playback device begins playing audio via the audio transducers when drawing current from the at least one battery.

12. The playback device of claim 1, wherein the program instructions that are executable by the at least one processor such that the playback device is configured to determine the calibration comprise program instructions that are executable by the at least one processor such that the playback device is configured to:

determine the calibration via an audio processing algorithm.

13. The playback device of claim 1, wherein the program instructions that are executable by the at least one processor such that the playback device is configured to determine the calibration comprise program instructions that are executable by the at least one processor such that the playback device is configured to:

determine, based on the captured audio, one or more measurements representing variations according to spatial position within the environment; and determine the calibration to at least partially offsets the variations according to spatial position within the environment.

14. The playback device of claim 1, wherein the program instructions that are executable by the at least one processor such that the playback device is configured to determine the calibration comprise program instructions that are executable by the at least one processor such that the playback device is configured to:

select, from among a plurality of calibration profiles, a pre-determined calibration profile having associated acoustic characteristics most closely matching the acoustic characteristics represented in the microphone data.

15. The playback device of claim 1, wherein the variations according to spatial position within the environment include frequency-dependent variations, and wherein the program instructions that are executable by the at least one processor such that the playback device is configured to determine the calibration comprise program instructions that are executable by the at least one processor such that the playback device is configured to:

determine the calibration to at least partially offsets the frequency-dependent variations.

16. The playback device of claim 1, wherein the housing is formed to sit upon a surface in a particular orientation, and wherein at least one of the audio transducers is carried by the housing to output audio in a parallel direction to the surface when the housing is sitting upon the surface in the particular orientation.

17. The playback device of claim 1, wherein the audio transducers carried by the housing comprise a woofer configured to output full-range frequencies and at least one tweeter configured to output high frequencies.

18. The playback device of claim 1, wherein the at least one non-transitory computer-readable medium further comprises program instructions that are executable by the at least one processor such that the playback device is configured to:

apply a user-selected equalization setting concurrently with the calibration.

19. A playback device comprising:

a user interface comprising a button;

audio transducers;

a microphone;

at least one processor;

a housing carrying the user interface, the audio transducers, the microphone, and the at least one processor; and at least one non-transitory computer-readable medium comprising program instructions that are executable by the at least one processor such that the playback device is configured to:

initiate a self-calibration each time (1) power to the playback device is turned on and (2) the button is pressed;

perform the self-calibration initiated when (1) power to the playback device was turned on and (2) the playback device began playing the audio via the audio transducers, wherein the program instructions that are executable by the at least one processor such that the playback device is configured to perform the self-calibration comprise program instructions that are executable by the at least one processor such that the playback device is configured to:

while playing the audio via the audio transducers, capture via the microphone, microphone data representing environmental acoustic characteristics;

based on the captured microphone data, determine a calibration that at least partially offsets the environmental acoustic characteristics; and apply the determined calibration; and play back additional audio via the audio transducers while the determined calibration is applied.

20. A system comprising:

a playback device comprising:

a user interface comprising a power toggle control;

audio transducers;

a microphone; and a housing carrying the user interface, the audio transducers, and the microphone; and at least one processor; and at least one non-transitory computer-readable medium comprising program instructions that are executable by the at least one processor such that the system is configured to:

initiate a self-calibration each time (1) power to the playback device is turned on and (2) the playback device begins playing audio via the audio transducers;

perform the self-calibration initiated when (1) power to the playback device was B turned on and (2) the playback device began playing the audio via the audio transducers, wherein the program instructions that are executable by the at least one processor such that the playback device is configured to perform the self-calibration comprise program instructions that are executable by the at least one processor such that the playback device is configured to:

while playing the audio via the audio transducers, capture via the microphone, microphone data representing environmental acoustic characteristics;

based on the captured microphone data, determine a calibration that at least partially offsets the environmental acoustic characteristics; and apply the determined calibration; and play back additional audio via the audio transducers while the determined calibration is applied.

* * * * *